(12) United States Patent
Lee et al.

(10) Patent No.: US 11,764,064 B2
(45) Date of Patent: Sep. 19, 2023

(54) MONITORING DEVICE, MONITORING METHOD AND METHOD OF MANUFACTURING SEMICONDUCTOR DEVICE USING REFLECTIVITY OF WAFER

(71) Applicant: Samsung Electronics Co., Ltd., Suwon-si (KR)

(72) Inventors: Nam Hoon Lee, Hwaseong-si (KR); Ill Hyun Park, Suwon-si (KR); Tae Hee Han, Hwaseong-si (KR); Jin Won Ma, Hwaseong-si (KR); Byung Joo Oh, Yongin-si (KR); Bong Ju Lee, Suwon-si (KR); Jae Hee Lee, Daegu (KR); Joo Yong Lee, Bucheon-si (KR); Nam Ki Cho, Seoul (KR); Chang Seong Hong, Incheon (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 73 days.

(21) Appl. No.: 17/479,256

(22) Filed: Sep. 20, 2021

(65) Prior Publication Data

US 2022/0076957 A1 Mar. 10, 2022

Related U.S. Application Data

(62) Division of application No. 16/393,232, filed on Apr. 24, 2019, now Pat. No. 11,158,510.

(30) Foreign Application Priority Data

Sep. 4, 2018 (KR) .................. 10-2018-0105078

(51) Int. Cl.
*G01N 21/25* (2006.01)
*H01L 21/268* (2006.01)
(Continued)

(52) U.S. Cl.
CPC .......... *H01L 21/268* (2013.01); *B23K 26/032* (2013.01); *B23K 26/354* (2015.10);
(Continued)

(58) Field of Classification Search
CPC .............. B23K 2103/56; B23K 26/032; B23K 26/354; G01N 2021/1782;
(Continued)

(56) References Cited

U.S. PATENT DOCUMENTS 6,366,308 B1   4/2002   Hawryluk et al.
6,747,245 B2   6/2004   Talwar et al.
(Continued)

FOREIGN PATENT DOCUMENTS

JP       01282832    * 11/1989 ............. G01R 31/00
JP   H06-018333 A2     1/1994
(Continued)

OTHER PUBLICATIONS

First Korean Office Action for corresponding application No. KR 10-2018-0105078 dated Dec. 23, 2022.

*Primary Examiner* — Vinh P Nguyen
(74) *Attorney, Agent, or Firm* — Muir Patent Law, PLLC

(57) ABSTRACT

Provided are a monitoring device and method. A monitoring device includes a laser processor configured to emit a processing laser beam to perform a melting annealing process on a wafer; a laser monitor configured to emit a monitoring laser beam onto the wafer while the laser processor performs the melting annealing process, the laser monitor configured to measure reflectivity of the wafer; and a data processor configured to process data on the reflectivity measured by the laser monitor, and monitor one or more characteristics of the wafer based on the data on the reflectivity.

8 Claims, 20 Drawing Sheets

(51) Int. Cl.
  *B23K 26/354* (2014.01)
  *H01L 21/67* (2006.01)
  *H01L 21/66* (2006.01)
  *B23K 26/03* (2006.01)

(52) U.S. Cl.
  CPC ....... *G01N 21/25* (2013.01); *H01L 21/67248* (2013.01); *H01L 22/12* (2013.01)

(58) Field of Classification Search
  CPC .......... G01N 2021/8416; G01N 21/25; G01N 21/45; G01N 21/55; G01N 21/8422; H01L 21/268; H01L 21/67248; H01L 22/12
  See application file for complete search history.

(56) References Cited

U.S. PATENT DOCUMENTS

| | | | |
|---|---|---|---|
| 7,098,155 B2 | 8/2006 | Talwar et al. | |
| 7,148,159 B2 | 12/2006 | Talwar et al. | |
| 7,154,066 B2 | 12/2006 | Talwar et al. | |
| 7,427,764 B2 | 9/2008 | Takami | |
| 8,546,805 B2* | 10/2013 | Shen | H01L 22/12 |
| | | | 257/14 |
| 8,822,353 B2 | 9/2014 | Anikitchev et al. | |
| 8,865,603 B2* | 10/2014 | Hawryluk | H01L 21/324 |
| | | | 438/795 |
| 9,018,562 B2* | 4/2015 | Dantus | B23K 26/382 |
| | | | 219/121.76 |
| 9,559,023 B2* | 1/2017 | McWhirter | H01L 21/324 |
| 2003/0151733 A1 | 8/2003 | Vatus et al. | |
| 2005/0282364 A1 | 12/2005 | Seki et al. | |
| 2012/0234810 A1* | 9/2012 | Kudo | H01L 29/66333 |
| | | | 219/121.85 |
| 2016/0181120 A1 | 6/2016 | Hawryluk et al. | |

FOREIGN PATENT DOCUMENTS

| | | |
|---|---|---|
| JP | 11274093 A2 | 10/1999 |
| JP | 2007-271399 A | 10/2007 |
| JP | 2008-211136 A | 9/2008 |
| JP | 2017-009450 A | 1/2017 |
| JP | 2017-028017 A | 2/2017 |
| KR | 10-2004-0078116 A | 9/2004 |
| KR | 10-2006-0048396 A | 5/2006 |
| KR | 10-1519527 B1 | 5/2015 |
| KR | 10-1547318 B1 | 8/2015 |
| KR | 10-2018-0012093 A | 2/2018 |
| KR | 10-2018-0098383 A | 9/2018 |
| WO | 06124963 A2 | 11/2006 |

* cited by examiner

Reflectivity converging model

Reflectivity oscillation model

Vs.

Low power
(Shallow melting depth)

High power
(Deep melting depth)

MONITORING DEVICE, MONITORING METHOD AND METHOD OF MANUFACTURING SEMICONDUCTOR DEVICE USING REFLECTIVITY OF WAFER

This application is a divisional of U.S. patent application Ser. No. 16/393,232 filed Apr. 24, 2019, which claims priority under 35 USC § 119 to Korean Patent Application No. 10-2018-0105078, filed on Sep. 4, 2018, in the Korean Intellectual Property Office, the disclosure of each of which being hereby incorporated by reference in its entirety.

BACKGROUND

1. Field

The present disclosure relates to a monitoring device and method. The present disclosure also relates to a method of manufacturing a semiconductor device.

2. Description of the Related Art

Among various processes performed in the manufacture of a semiconductor device, a melting annealing process is a process of melting the surface of a wafer by heating the wafer to a high temperature. Although there are various methods of heating a wafer, a method of heating an upper portion of a wafer to a high temperature by using a laser is often used. In particular, a recent melting annealing process is performed for several nanoseconds to several tens of nanoseconds. Thus, semiconductor devices are heated and melted for a very short time.

When a wafer is melted according to such a melting annealing process, it is beneficial to perform in-situ monitoring in order to manage process dispersion, productivity, quality, etc. and to check whether the wafer is melted to an intended level. For example, in-situ monitoring may be used to identify the characteristics of the wafer on which the melting annealing process is performed, such as whether a melting depth corresponds to an intended depth and whether the wafer is evenly melted.

However, when a melting process is performed for a very short time of several nanoseconds to several tens of nanoseconds as mentioned above, a method of precisely monitoring the melting process during that time is helpful.

SUMMARY

Aspects of the present disclosure provide a monitoring device and method capable of precisely in-situ monitoring a melting annealing process performed for a very short time of several nanoseconds to several tens of nanoseconds.

Aspects of the present disclosure also provide a monitoring device and method capable of in-situ identifying the characteristics of a wafer on which a melting annealing process is performed.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

According to an aspect of the present disclosure, there is provided a monitoring device including a laser processor configured to emit a processing laser beam to perform a melting annealing process on a wafer; a laser monitor configured to emit a monitoring laser beam onto the wafer while the laser processor performs the melting annealing process, the laser monitor configured to measure reflectivity of the wafer; and a data processor configured to process data on the reflectivity measured by the laser monitor, and monitor one or more characteristics of the wafer based on the data on the reflectivity.

According to another aspect of the present disclosure, there is provided a monitoring device including a support configured to receive a wafer comprising a first die and a second die; a laser processor configured to perform a first melting annealing process by emitting a processing laser beam to the first die and a second melting annealing process by emitting the processing laser beam to the second die; first and second light sensors; a laser monitor configured to measure first reflectivity of the first die in combination with the first and second light sensors by emitting a monitoring laser beam to the first die while the laser processor performs the first melting annealing process, the laser monitor configured to measure second reflectivity of the second die in combination with the first and second light sensors by emitting the monitoring laser beam to the second die while the laser processor performs the second melting annealing process; and a data processor configured to monitor characteristics of the wafer based on the first reflectivity and the second reflectivity measured by the laser monitor.

According to still another aspect of the present disclosure, there is provided a monitoring device including a laser processor configured to perform a melting annealing process on a wafer by emitting a processing laser beam to the wafer; first and second light sensors configured to receive light signal; a laser monitor configured to measure reflectivity of the wafer in combination with the first and second light sensors by emitting a monitoring laser beam to the wafer while the laser processor performs the melting annealing process; a thermal detector configured to detect temperature of a surface of the wafer while the laser processor performs the melting annealing process; a controller configured to control at least one of the laser processor, the laser monitor and the thermal detector; and a feedback circuit configured to provide the controller with feedback data according to a value of at least one of the measured reflectivity and temperature, wherein the controller is configured to adjust a setting of at least one of the laser processor, the laser monitor and the thermal detector according to the feedback data.

According to still another aspect of the present disclosure, there is provided a monitoring method including performing a melting annealing process on a wafer by emitting a processing laser beam to the wafer; measuring reflectivity of the wafer by emitting a monitoring laser beam to the wafer while the melting annealing process is performed; and monitoring characteristics of the wafer based on the measured reflectivity.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
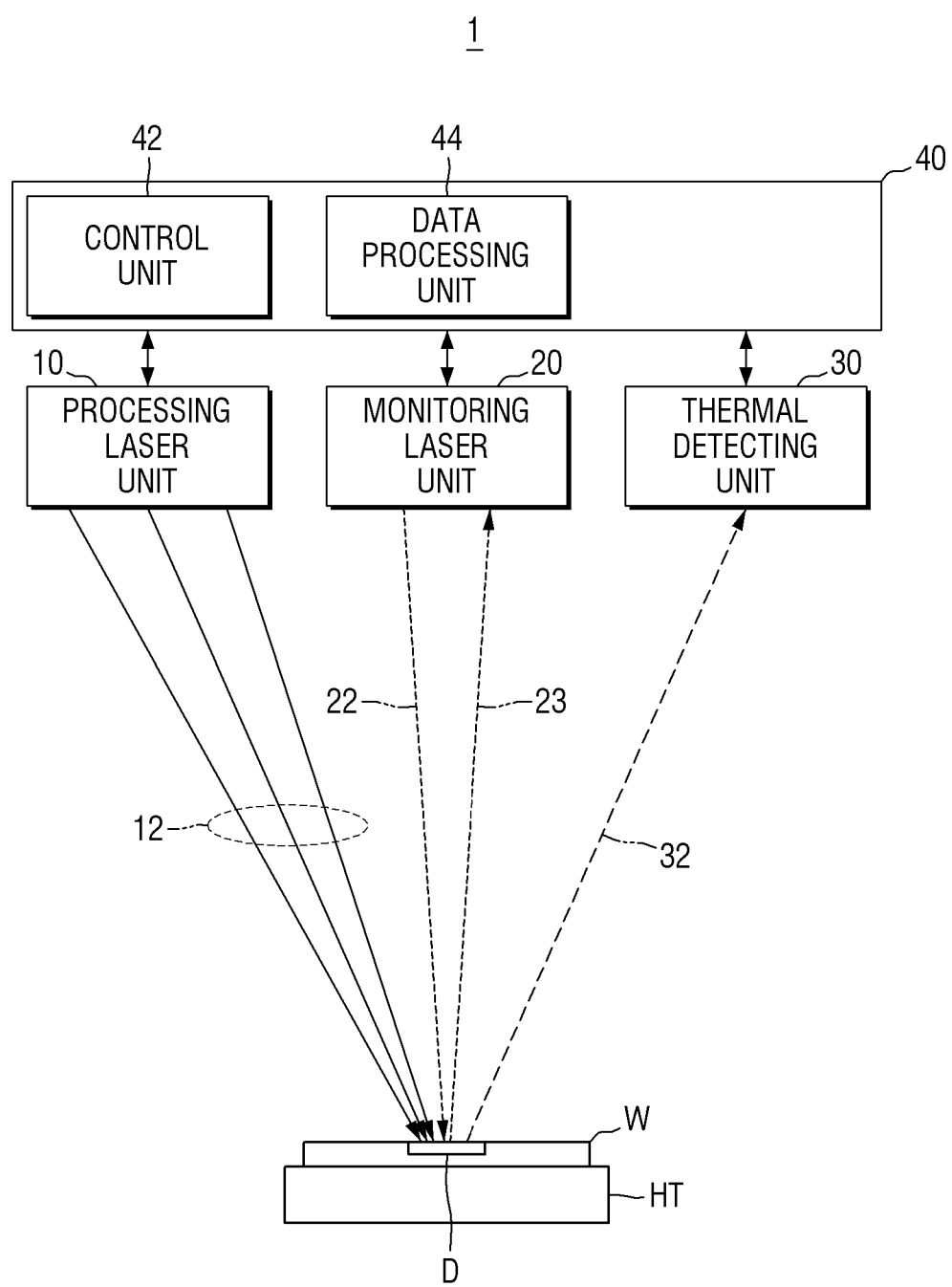
FIG. 1 is a schematic diagram of a monitoring system according to an embodiment.

FIG. 1 is a schematic diagram of a monitoring system 1 according to an embodiment.

Referring to FIG. 1, the monitoring system 1 according to the embodiment may include a processing laser unit 10, a monitoring laser unit 20, a thermal detecting unit 30, and a control board 40.

The processing laser unit 10 may perform a melting annealing process on a wafer W by emitting a processing laser beam 12 to the wafer W. For example, the processing laser unit 10 emits the processing laser beam 12 in order to heat an upper portion of the wafer W to a high temperature, and the high temperature at this time may be, for example, about 1,200° C. or more. For example, the processing laser unit 10 may melt the upper portion of the wafer W using the processing laser beam 12 for a short time of several nanoseconds to several tens of nanoseconds. The processing laser unit 10 and other components having the same name in the other embodiments of the current disclosure may be a laser processor. The processing laser beam 12 and other components having the same name in the other embodiments of the current disclosure are laser beams.

In an embodiment, the wafer W may be heated first by a heater chuck HT before being heated to a high temperature by the processing laser beam 12. For example, the heater chuck HT serves not only to support the wafer W but also to heat the wafer W before the emission of the processing laser beam 12. The heater chuck may heat the wafer W to a temperature from about 200° C. to about 400° C. For example, the heater chuck HT may include an electric heating element, e.g., nichrome, cupronickel, etc., in the heater chuck HT.

In the current embodiment, the processing laser beam 12 may have a wavelength of, for example, 532 nm. In certain embodiments, the processing laser beam may include a light wave having wavelength between 450 nm and 600 nm.

The monitoring laser unit 20 may perform in-situ monitoring of the characteristics of the wafer W, on which the melting annealing process is performed, based on the reflectivity of the wafer W that may be identified through a monitoring laser beam 22 and reflected light 23. For example, the reflected light 23 may be a portion of the monitoring laser beam 22 indecent on a surface of the wafer W. For example, while the processing laser unit 10 performs the melting annealing process, the monitoring laser unit 20 may perform in-situ monitoring by emitting the monitoring laser beam 22 to the wafer W, receiving the reflected light 23 and measuring the reflectivity of the water W based on the received reflected light 23. The monitoring laser unit 20 and other components having the same name in the other embodiments of the current disclosure may be referred to as a laser monitor in that the monitoring laser units monitor characteristics of wafers with laser beams. The monitoring laser beam 22 and other components having the same name in the other embodiments of the current disclosure are laser beams and may be called as a monitoring laser beam.

For example, the monitoring laser unit 20 may measure the reflectivity of the wafer W by comparing the intensity of the monitoring laser beam 22 incident on the wafer W with the intensity of the reflected light 23 reflected from the wafer W. However, a specific method of measuring reflectivity may vary depending on the implementation method.

In the current embodiment, the monitoring laser beam 22 may have a wavelength of, for example, 658 nm. In certain embodiments, the monitoring laser beam 22 may include a light wave having a wavelength between 600 nm and 700 nm.

The thermal detecting unit 30 may perform in-situ monitoring of the characteristics of the wafer W, on which the melting annealing process is performed, based on the temperature of the surface of the wafer W that may be identified through emitted heat 32. For example, the thermal detecting unit 30 may perform in-situ monitoring by detecting the temperature of the surface of the wafer W while the processing laser unit 10 performs the melting annealing process. The thermal detecting unit 30 may be a thermal detector.

In the current embodiment, the thermal detecting unit 30 may include an InGaAs sensor.

In the current embodiment, the thermal detecting unit 30 may detect the temperature of the surface of the wafer W by receiving a signal of a wavelength of 1550 ran of the emitted heat 32. In certain embodiments, the thermal detecting unit 30 may determine the temperature of the surface of the wafer by receiving an electromagnetic wave having a wavelength between 1000 nm and 2000 nm.

The control board 40 may control the monitoring system 1 according to the embodiment and may include a control unit 42 and a data processing unit 44.

The control unit 42 may control at least one of the processing laser unit 10, the monitoring laser unit 20 and the thermal detecting unit 30. For example, the control unit 42 may perform control such as changing the wavelength of the processing laser beam 12 emitted from the processing laser unit 10, adjusting the power, or adjusting the emission time. For another example, the control unit 42 may perform control such as changing the wavelength of the monitoring laser beam 22 emitted from the monitoring laser unit 20 or adjusting the emission time. The control unit 42 may be a controller, and may include a logic circuit integrated in a semiconductor chip.

The data processing unit 44 may process data on the reflectivity measured by the monitoring laser unit 20 or processes data on the temperature measured by the thermal detecting unit 30. The characteristics of the wafer W may be monitored based on these data. The data processing unit 44 may be a data processor including a logic circuit, e.g., a processor chip and/or other semiconductor chips.

Here, the characteristics of the wafer W refer to the characteristics of the wafer Won which the melting annealing process is performed. For example, the characteristics of the wafer W may include the melting depth of the wafer W, the uniformity of the melting depth, the size of grains, the doping concentration of a film, the type of the film, and the sheet resistance of the film.

For example, the melting depth of the wafer W is a characteristic indicating the depth of the upper portion of the wafer W where melting is caused by the processing laser beam 12. The uniformity of the melting depth is a characteristic indicating whether the depth at which the melting occurs is uniform across the entire area or across a predetermined area of the water W. The size of the grains is a characteristic indicating the size of grains formed by particles in a melted portion after the melting of the upper portion of the wafer W is performed/completed. The doping concentration of the film is a characteristic indicating the doping concentration of a semiconductor film formed on the wafer W. The type of the film is a characteristic indicating whether the semiconductor film formed on the wafer W is made of, for example, amorphous silicon, polysilicon, or crystalline silicon.

Regarding FIG. 2, a monitoring device according to an embodiment will now be described in terms of implementing the processing laser unit 10, the monitoring laser unit 20 and the thermal detecting unit 30.

Figure 2:
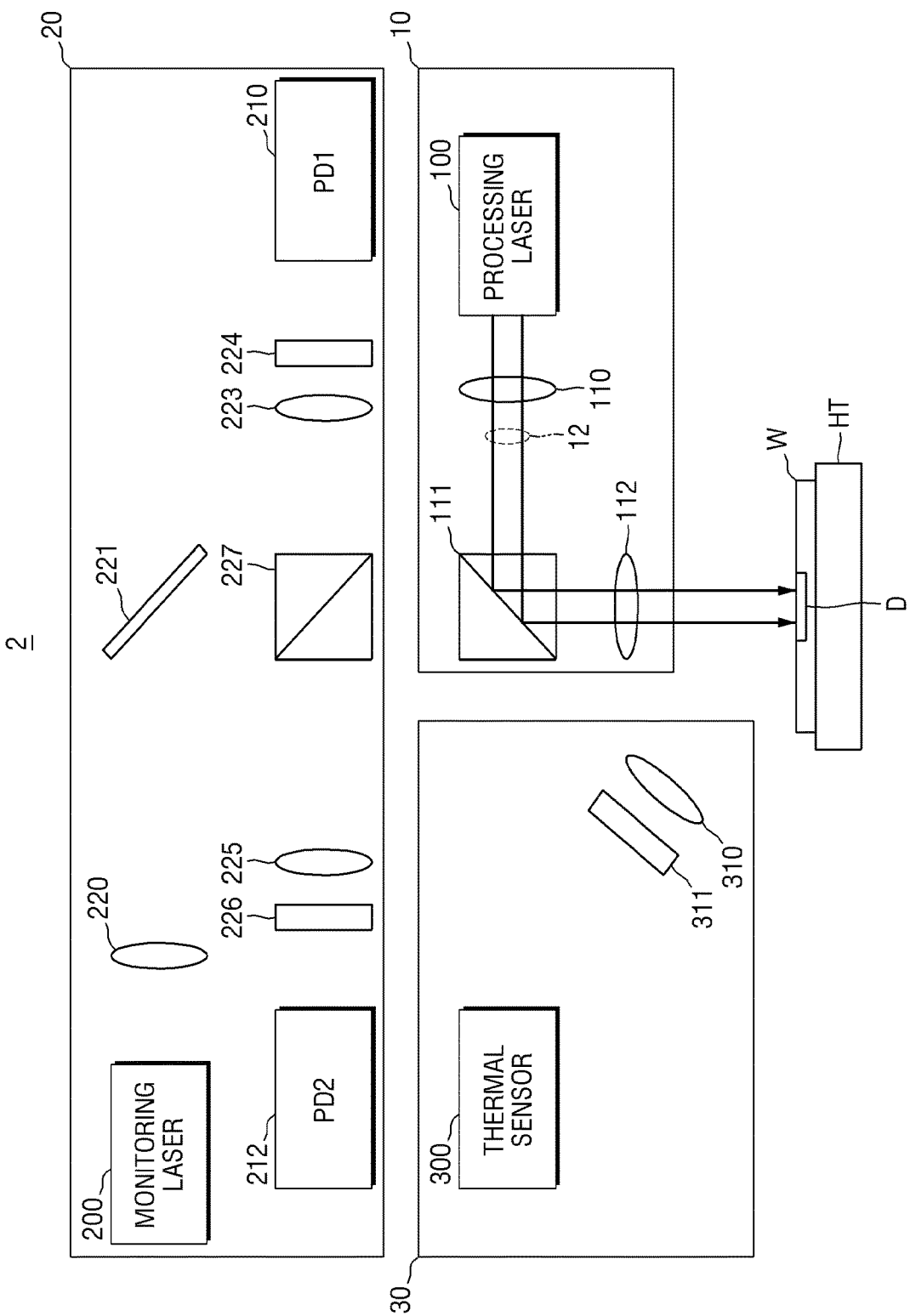
FIG. 2 illustrates a monitoring device according to an embodiment.

FIG. 2 illustrates a monitoring device 2 according to an embodiment.

Referring to FIG. 2, the monitoring device 2 according to the embodiment includes a processing laser unit 10, a monitoring laser unit 20 and a thermal detecting unit 30 as described above with reference to FIG. 1.

The processing laser unit 10 may include a processing laser emitter 100, lenses 110 and 112, and a path changing optics 111.

The processing laser emitter 100 emits a processing laser beam 12 for melting an upper portion of a wafer W. The path of the processing laser beam 12 reaching the path changing optics 111 via the lens 110 is modified such that the processing laser beam 12 travels toward the wafer W, The processing laser beam 12 whose path has been modified passes through the lens 112 and then reaches the wafer W. For example, the processing laser beam 12 may be a laser beam, and the processing laser emitter 100 may emit the processing laser beam and may also be referred to as a processing laser beam emitter. This description may be similarly applied to the other embodiments of the present disclosure.

The monitoring laser unit 20 includes a monitoring laser emitter 200, a first light receiving unit 210, a second light receiving unit 212, lenses 220, 223 and 225, path changing optics 221 and 227, and filters 224 and 226.

The monitoring laser emitter 200 emits a monitoring laser beam 22 for in-situ monitoring of the characteristics of the wafer W on which a melting annealing process is performed, and the reflectivity of the wafer W is measured using the first light receiving unit 210, the second light receiving unit 212, the lenses 220, 223 and 225, the path changing optics 221 and 227, and the filters 224 and 226. This will be described in more detail later with reference to FIGS. 4 through 6. The first and second light receiving units 210 and 212 may receive light signals and may be respectively referred to as a first light receiver and a second light receiver and may respectively include a first light sensor and a second light sensor (e.g., photodetectors), and light receiving units throughout the present disclosure may be also respectively called as light receivers or light sensors. For example, the first and second light receiving units 210 and 212 may be photodetectors, such as photodiodes.

The thermal detecting unit 30 may include a thermal sensor 300, a lens 310, and a filter 311.

The thermal sensor 300 senses heat 32 emitted from the wafer W on which the melting annealing process is performed by using the lens 310 and the filter 311, This will be described in more detail later with reference to FIG. 13.

It should be noted that the configuration of the monitoring device 2 illustrated in FIG. 2 is merely an embodiment, and the detailed configuration of the processing laser unit 10, the monitoring laser unit 20 and the thermal detecting unit 30 may be modified variously according to the purpose of implementation.

Figure 3:
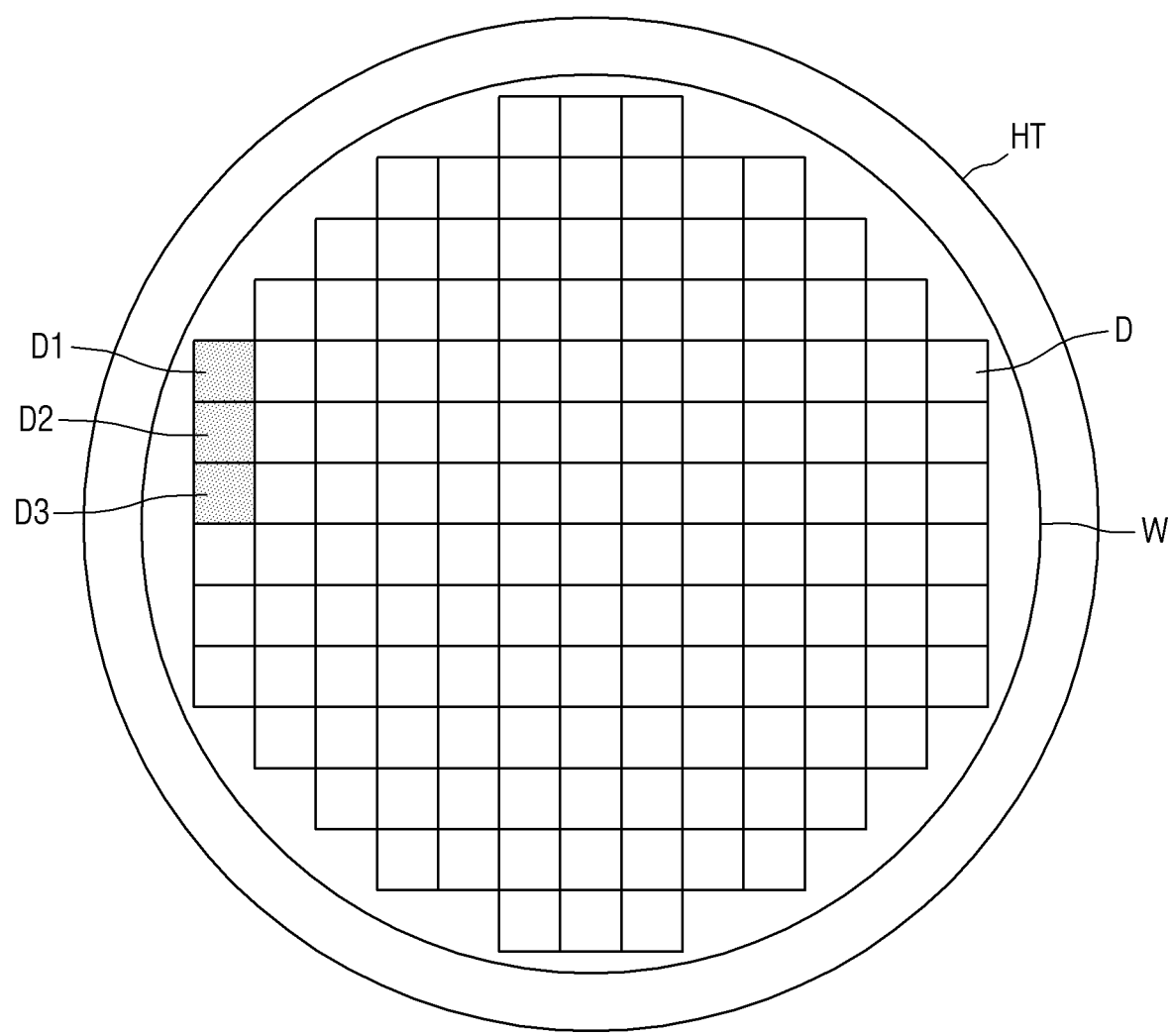
FIG. 3 illustrates a wafer on which a melting annealing process and monitoring are performed according to an embodiment.

FIG. 3 illustrates a wafer W on which a melting annealing process and monitoring are performed according to an embodiment.

Referring to FIG. 3, a plurality of dies are formed on the wafer W supported by the heater chuck FIT. Semiconductor devices are formed on each of the dies D, and each die D on which the semiconductor devices have been formed may be sliced into a plurality of chips. Each of the chips may then be packaged and completed as a product.

In an embodiment, the processing laser unit 10 may perform a melting annealing process on the wafer W on a die-by-die basis. For example, the processing laser unit 10 may perform a first melting annealing process by emitting the processing laser beam 12 to a first die D1 and then perform a second melting annealing process by emitting the processing laser beam 12 to a second die D2.

For example, the processing laser unit 10 may melt an upper portion of the first die D1 by emitting the processing laser beam 12 to the first die D1 and then melt an upper portion of the second die D2 by emitting the processing laser beam 12 to the second die D2. After processing the second die D2, the processing laser unit 10 may melt an upper portion of a third die D3 by emitting the processing laser beam 12 to the third die D3.

The above description of the first through third dies D1 through D3 is merely an example, and the scope of the present disclosure is not limited to the above order. For example, the processing laser unit 10 may perform a melting annealing process on the wafer W on a die-by-die basis in any predetermined order.

One of the reasons for performing the melting annealing process on a die-by-die basis is that the power of the processing laser beam 12 may be insufficient to heat the entire area of the wafer W to a high temperature. In certain embodiments, the power of the processing laser beam 12 may be enough to heat plural dies together at a time, and several dies may be heated to a high temperature. For example, the processing laser unit 10 may perform a melting annealing process in units of several dies D (e.g., in units of two dies 1) or in units of three or more dies D).

In the above embodiment illustrated in FIG. 3, the monitoring laser unit 20 may measure the reflectivity of the wafer W for each die D formed on the wafer W. For example, the monitoring laser unit 20 may measure first reflectivity of the first die D1 by emitting the monitoring laser beam 22 to the first die D1 while the processing laser unit 10 performs the first melting annealing process and then measure second reflectivity of the second die D2 by emitting the monitoring laser beam 22 to the second first die D2 while the processing laser unit 10 performs the second melting annealing process.

The data processing unit 44 may then monitor the characteristics of the wafer W based on data about the first reflectivity and the second reflectivity measured by the monitoring laser unit 20.

Likewise, in the current embodiment, the thermal detecting unit 30 may detect the temperature of the surface of the wafer W for each die D formed on the wafer W. For example, the thermal detecting unit 30 may detect a first temperature of the surface of the first die D1 while the processing laser unit 10 performs the first melting annealing process and then detect a second temperature of the surface of the second die D2 while the processing laser unit 10 performs the second melting annealing process.

The data processing unit 44 may then monitor the characteristics of the wafer W based on data about the first temperature and the second temperature measured by the thermal detecting unit 30.

In certain embodiments, the power of the processing laser beam 12 may allow that several dies together may be heated at a time to a high temperature, and the processing laser unit 10 may perform a melting annealing process in units of several dies D (e.g., in units of two dies D or in units of three or more dies D), and the monitoring laser unit 20 and the thermal detecting unit 30 may also measure reflectivity and detect temperature in units of several or more dies D at a time.

Figure 4:
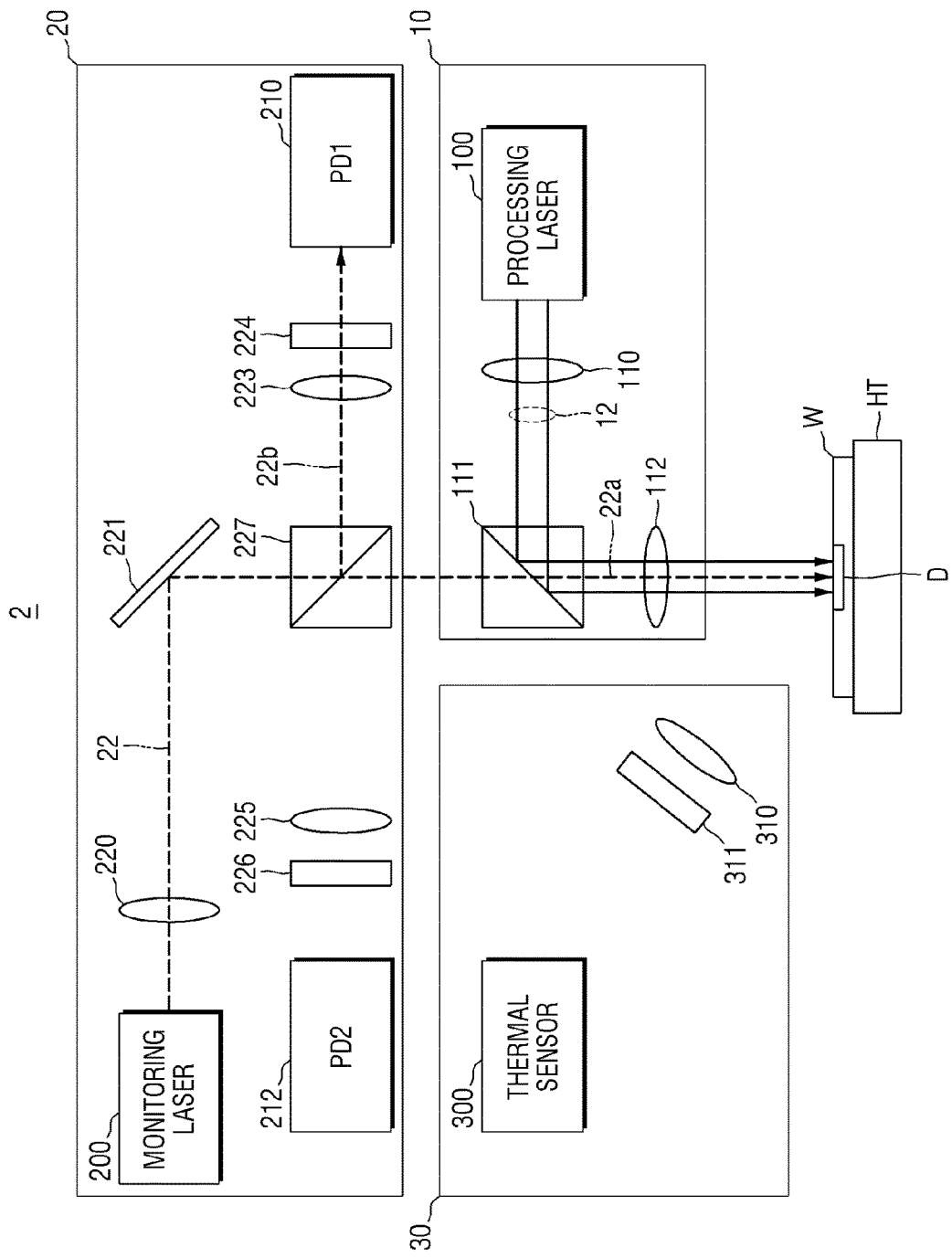
FIGS. 4 through 6 are diagrams for explaining the operation of measuring the reflectivity of a wafer using the monitoring device of FIG. 2.
Figure 5:
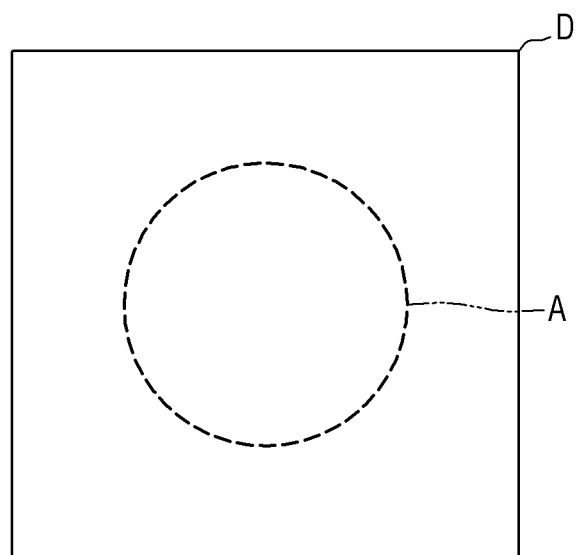
Figure 6:
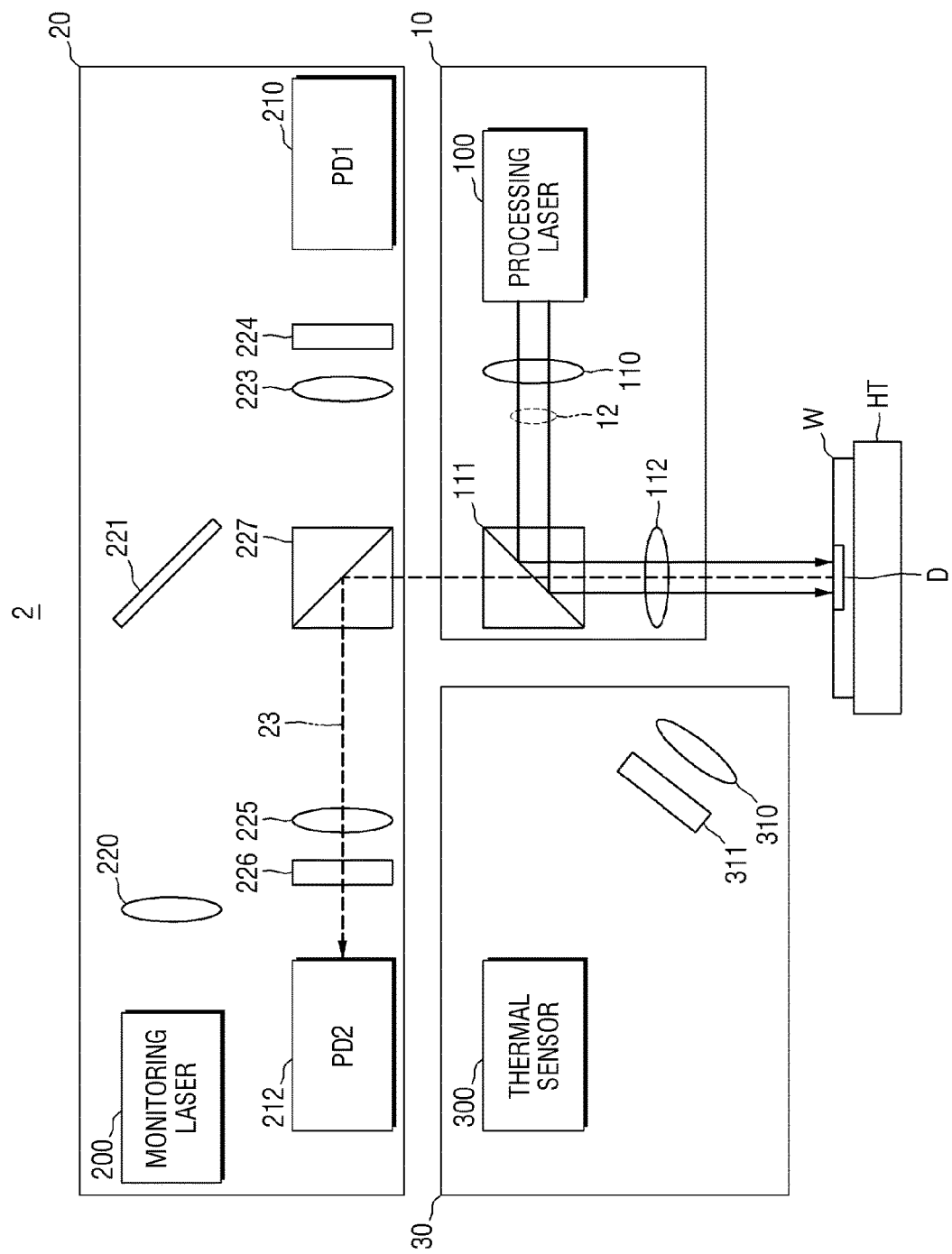

FIGS. 4 through 6 are diagrams for explaining the operation of measuring the reflectivity, of a wafer W using the monitoring device 2 of FIG. 2.

Referring to FIG. 4, the monitoring laser unit 20 may include the monitoring laser emitter 200, the first light receiving unit 210, the second light receiving unit 212, the lenses 220, 223 and 225, the path changing optics 221 and 227, and the filters 224 and 226.

The monitoring laser emitter 200 of the monitoring laser unit 20 emits the monitoring laser beam 22 while the processing laser unit 10 performs a melting annealing process using the processing laser beam 12. The monitoring laser beam 22 passes through the lens 220 and changes its travelling direction to the wafer W according to the path changing optics 221. The monitoring laser beam 22 that has changed its traveling direction travels to the first light receiving unit 210 and the path changing optics 111 according to the path changing optics 227.

The first light receiving unit 210 receives the monitoring laser beam 22 incident on the wafer W. However, when the first light receiving unit 210 directly receives the monitoring laser beam 22 itself, the monitoring laser beam 22 may not reach the wafer W. Therefore, the first light receiving unit 210 receives reference light 22b traveling along a path branched by the path changing optics 227. For example, the path changing optics 227 may split the monitoring laser beam 22 into two laser beams and send one of them to the wafer W and the other of them to the light receiving unit 210.

For example, the reference light 22b travelling along the path branched from the monitoring laser beam 22 by the path changing optics 227 passes through the lens 223 and the filter 224 and enters the first light receiving unit 210. In an embodiment, the filter 224 may be a filter for passing light having a wavelength of, e.g., 658 nm. In certain embodiments, the path changing optics 227 may reflect/transmit the monitoring laser beam 22 toward the light receiving unit 210 in a first period of time, and toward the wafer W in a second period of time.

A monitoring laser beam 22a travelling to the path changing optics 111 may pass through the lens 112 and enter the wafer W. Here, referring to FIG. 5, when the monitoring laser beam 22a is incident on a die D, a cross section of the incident light 22a may be represented by an area A as illustrated in FIG. 5.

Next, referring to FIG. 6, the second light receiving unit 212 receives the reflected light 23 reflected from the wafer W. The reflected light 23 passes through the lens 112 and the path changing optics 111 and then changes its travelling direction to the second light receiving unit 212 according to the path changing optics 227, For example, the path changing optics 227 may change the path of at least a portion or all of the reflected light coming from the wafer W so that the portion or all of the reflected light incident to the second light receiving unit 212. The reflected light 23 that has changed its traveling direction passes through the lens 225 and the filter 226 and enters the second light receiving unit 212. In an embodiment, the filter 226 may be a filter for passing light having a wavelength of, e.g., 658 nm.

The monitoring laser unit 20 may measure reflectivity using the first light receiving unit 210 and the second light receiving unit 212. For example, the monitoring laser unit 20 may measure reflectivity by comparing the intensity of the reference light 22b received through the first light receiving unit 210 with the intensity of the reflected light 23 received through the second light receiving unit 212.

For example, when the processing laser unit 10 performs a melting annealing process on the wafer W on a die-by-die basis as described with respect to FIG. 3, the monitoring laser unit 20 may measure the first reflectivity of the first die D1 and the second reflectivity of the second die D2 by comparing the intensities of the monitoring laser beam 22 incident on the first die D1 and the second die D2 with the intensities of the reflected light 23 reflected from the first die D1 and the second die D2, respectively.

Here, the first light receiving unit 210 may receive the monitoring laser beam 22 incident on the first die D1 and the second die D2, the second light receiving unit 212 may receive the reflected light 23 reflected from the first die D1 and the second die D2, and the monitoring laser unit 20 may measure reflectivity by using the first light receiving unit 210 and the second light receiving unit 212.

Figure 7:
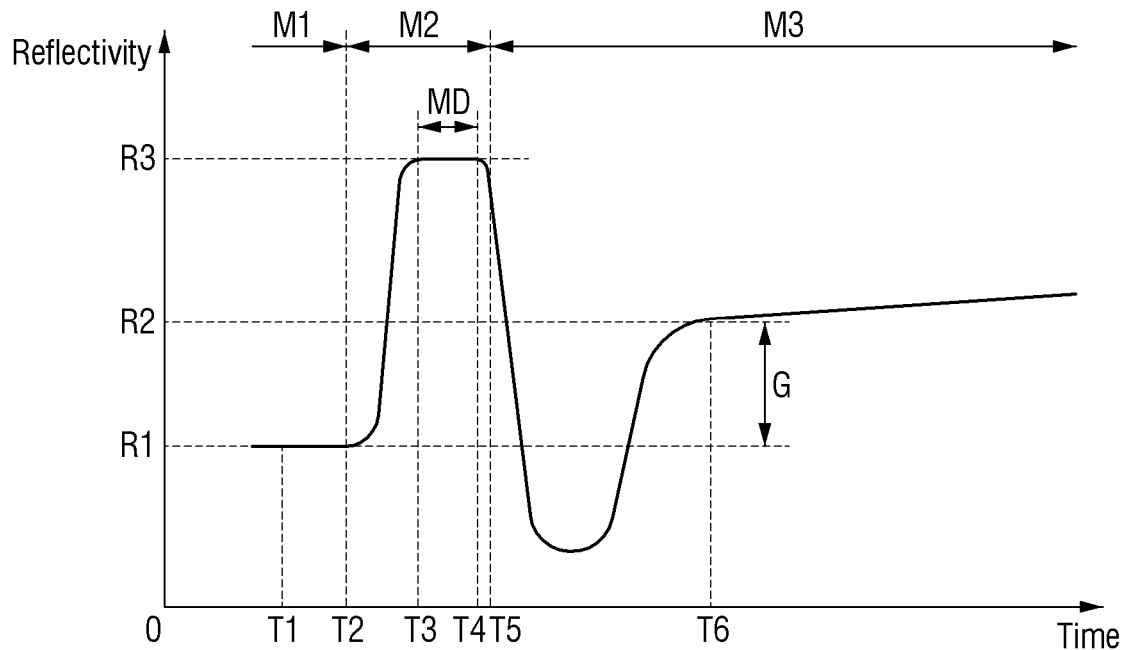
FIG. 7 is a graph illustrating an example of change in reflectivity measured by the monitoring device according to the embodiment.

FIG. 7 is a graph illustrating an example of change in reflectivity measured by the monitoring device 2 according to the embodiment.

Referring to FIG. 7, the change in reflectivity measured by the monitoring device 2 as described above may be divided into a first section M1, a second section M2, and a third section M3.

The first section M1 refers to a section before the melting of an upper portion of a wafer W is started. For example, in the first section M1 of the reflectivity, the portion of the wafer W, e.g., the surface of the wafer W, on which the monitoring laser beam is incident and from which the monitoring laser beam is reflected may be in solid state. In the first section M1, the reflectivity measured by the monitoring laser unit 20 may have a value of, e.g. R1.

The second section M2 is a section in which the melting of the upper portion of the wafer W occurs. In the second section M2, a first sub-section from a time T2 to a time T3 is a period in which the upper portion of the wafer W melts from a solid to a liquid, and the reflectivity measured by the monitoring laser unit 20 may increase from R1 to, e.g., R3 in this section.

In the second section M2, a second sub-section from the time T3 to a time T4 is a period in which the upper portion of the wafer W may be only in the liquid state. For example, the measured area of the wafer W may be all liquid state in the second sub-section. The second sub-section may be defined as melting duration MD. The reflectivity measured by the monitoring laser unit 20 in this section may be maintained at, e.g., R3.

In the second section 1442, a section from the time T4 to a time 15 is a section in which the emission of the processing laser beam 12 is stopped and the upper portion of the water W starts to be cooled. The reflectivity measured by the monitoring laser unit 20 may start to fall from R3 in this section.

The third section M3 is a section in which the upper portion of the wafer W is cooled down. When the upper portion of the wafer W is cooled in the third section M3, the size of grains that form the upper portion of the wafer W increases. For example, the grain size at a time 16 of the third section M3 is larger than the grain size at the time T1 of the first section M1, and the reflectivity R2 measured at the time T6 of the third section M3 by the monitoring laser unit 20 has a larger/greater value than the reflectivity R1 measured at the time T1 of the first section M1 by the monitoring laser unit 20.

It should be noted that the pattern of change in reflectivity illustrated in FIG. 7 may vary depending on the specific environment or condition of a melting annealing process. However, the monitoring device 2 of the present disclosure may define the pattern of change in reflectivity in a specific environment and condition as a reference pattern and then monitor the characteristics of the wafer W by comparing reflectivity obtained during an actual melting annealing process performed under the same or similar environment and condition with the reference pattern.

Figure 8:
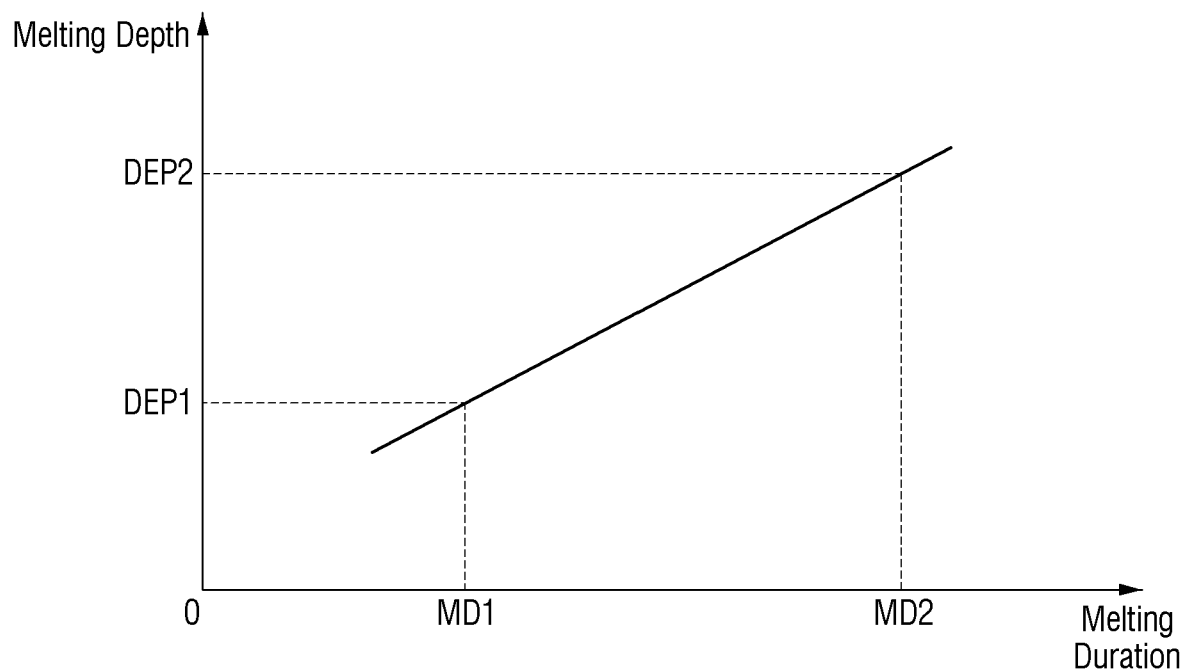
FIG. 8 is a graph illustrating the relationship between melting duration and melting depth.

FIG. 8 is a graph illustrating the relationship between the melting duration and the melting depth.

Referring to FIG. 8, the melting duration MD described with respect to FIG. 7 and the melting depth of the upper portion of the wafer W may have a substantially proportional relationship. Therefore, when the melting duration MD1 is relatively short as a result of analyzing the change in reflectivity, it may be predicted that the melting depth DEP1 of the upper portion of the wafer W is relatively shallow. Conversely, when the melting duration MD2 is relatively long, it may be predicted that the melting depth DEP2 of the upper portion of the wafer W is relatively deep. The term "substantially" may be used in the present disclosure to emphasize this meaning, unless the context or other statements indicate otherwise. For example, items described as "substantially proportional," "substantially the same," "substantially equal," or "substantially planar," may be exactly proportional, the same, equal, or planar, or may be the same, equal, or planar within acceptable variations that may occur, for example, due to manufacturing processes.

Accordingly, the data processing unit 44 of the control board 40 according to the embodiment may judge the melting duration based on data about the reflectivity measured by the monitoring laser unit 20 and predict the melting depth based on the length of the melting duration.

Figure 9:
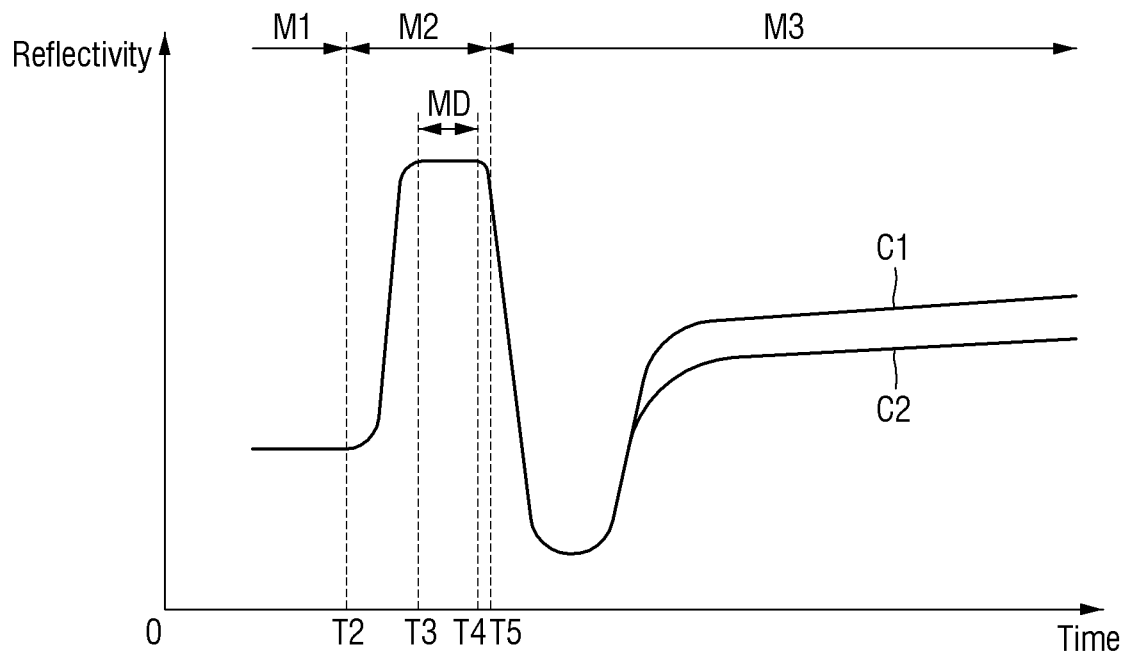
FIG. 9 is a graph illustrating another example of change in reflectivity measured by the monitoring device according to the embodiment.

FIG. 9 is a graph illustrating another example of change in reflectivity measured by the monitoring device 2 according to the embodiment.

Referring to FIG. 9, the doping concentration of a film coated on the wafer W may be identified by analyzing the change in reflectivity.

For example, when the film coated on the wafer W in a process prior to a melting annealing process has a doping concentration of, e.g., 7E20, the change in reflectivity may be represented by a graph C1. Alternatively, when the film coated on the wafer W in the process prior to the melting annealing process has a doping concentration of, e.g., 11E20, the change in reflectivity may be represented by a graph C2.

In this case, when there is a constraint/precondition that the film coated on the wafer W must satisfy the doping concentration of, e.g., 7E20 in order for the melting annealing process to be performed, when reflectivity data shows the trend of the graph C2 as a result of analyzing the change in reflectivity measured by the monitoring laser unit 20, it may be determined that a problem or failure may have occurred in a previous process.

Figure 10:
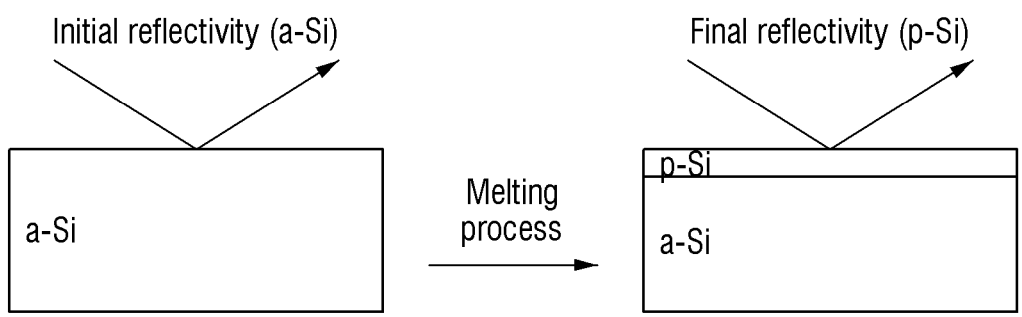
FIG. 10 is a diagram for explaining that reflectivity ay vary according to the type of film.

For example, the data processing unit 44 of the control board 40 according to the embodiment may predict the failure of the previous process based on data about the reflectivity measured by the monitoring laser unit 20, FIG. 10 is a diagram for explaining that reflectivity may vary according to the type of film.

Referring to FIG. 10, the type of the film coated on the wafer may be identified by analyzing reflectivity.

For example, the change in reflectivity may be represented by different graphs when the film coated on the wafer W in a process before performing the melting annealing process is made of amorphous silicon (a-Si), polysilicon (p-Si), and/or crystalline silicon (c-Si).

In certain embodiments, when an upper portion of an amorphous silicon (a-Si) layer melted according to the melting annealing process is changed to polysilicon (p-Si), the change in reflectivity may also be represented by a graph.

For example, the data processing unit 44 of the control board 40 according to the embodiment may predict the failure of the previous process or predict a material change before and after the melting annealing process by predicting the type of the film coated on the wafer \V based on data about the reflectivity measured by the monitoring laser unit 20.

Figure 11:
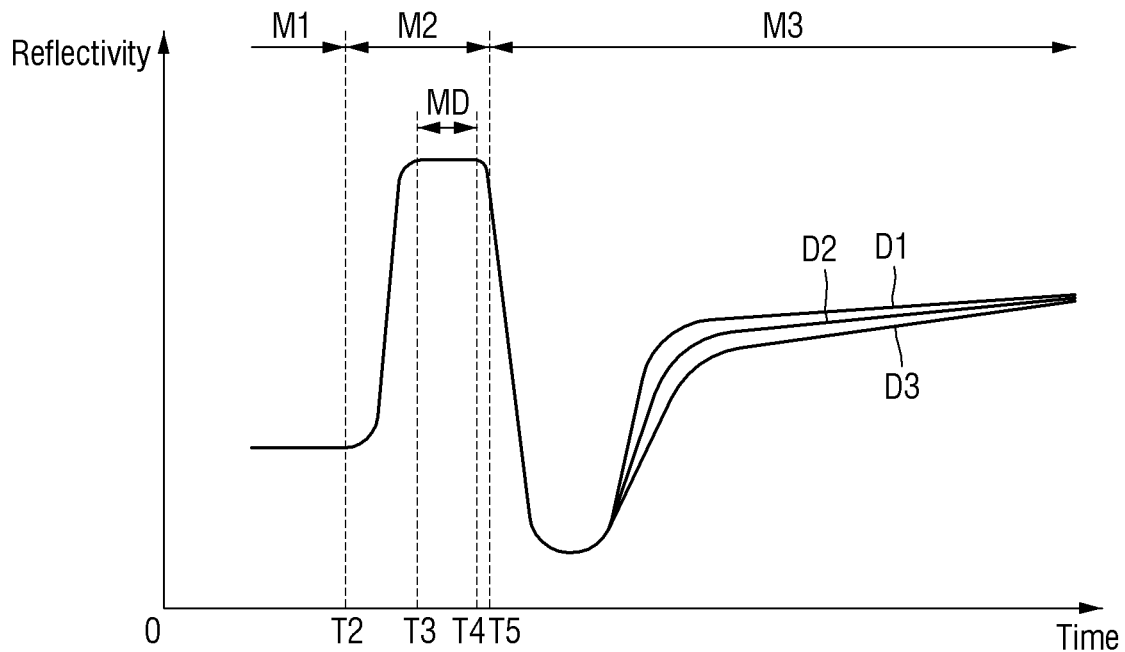
FIG. 11 is a graph illustrating another example of change in reflectivity measured by the monitoring device according to the embodiment.
Figure 12:
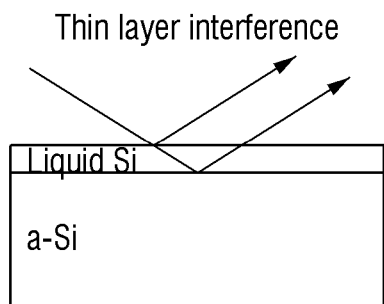
FIG. 12 is a diagram for explaining that reflectivity may vary according to the melting depth.
Figure 12:
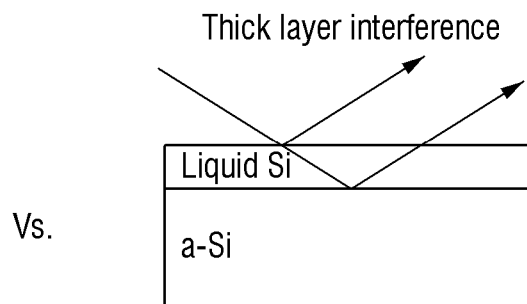

FIG. 11 is a graph illustrating another example of change in reflectivity measured by the monitoring; device 2 according to the embodiment. FIG. 12 is a diagram for explaining that reflectivity may vary according to the melting depth.

Referring to FIGS. 11 and 12, the melting depth of the upper portion of the wafer W may also be predicted by analyzing the period of change in reflectivity.

As apparent from FIG. 12, a deep melting depth may result in a longer period of change in reflectivity than a shallow melting depth. For example, different melting depth may result in different graphs.

For example, when the melting depth is a first depth which is shallowest, the change in reflectivity may be represented by a graph D1 When the melting depth is a third depth which is deepest, the change in reflectivity may be represented by a graph D3. When the melting depth is a second depth which is between the first depth and the third depth, the change in reflectivity may be represented by a graph D2.

Figure 13:
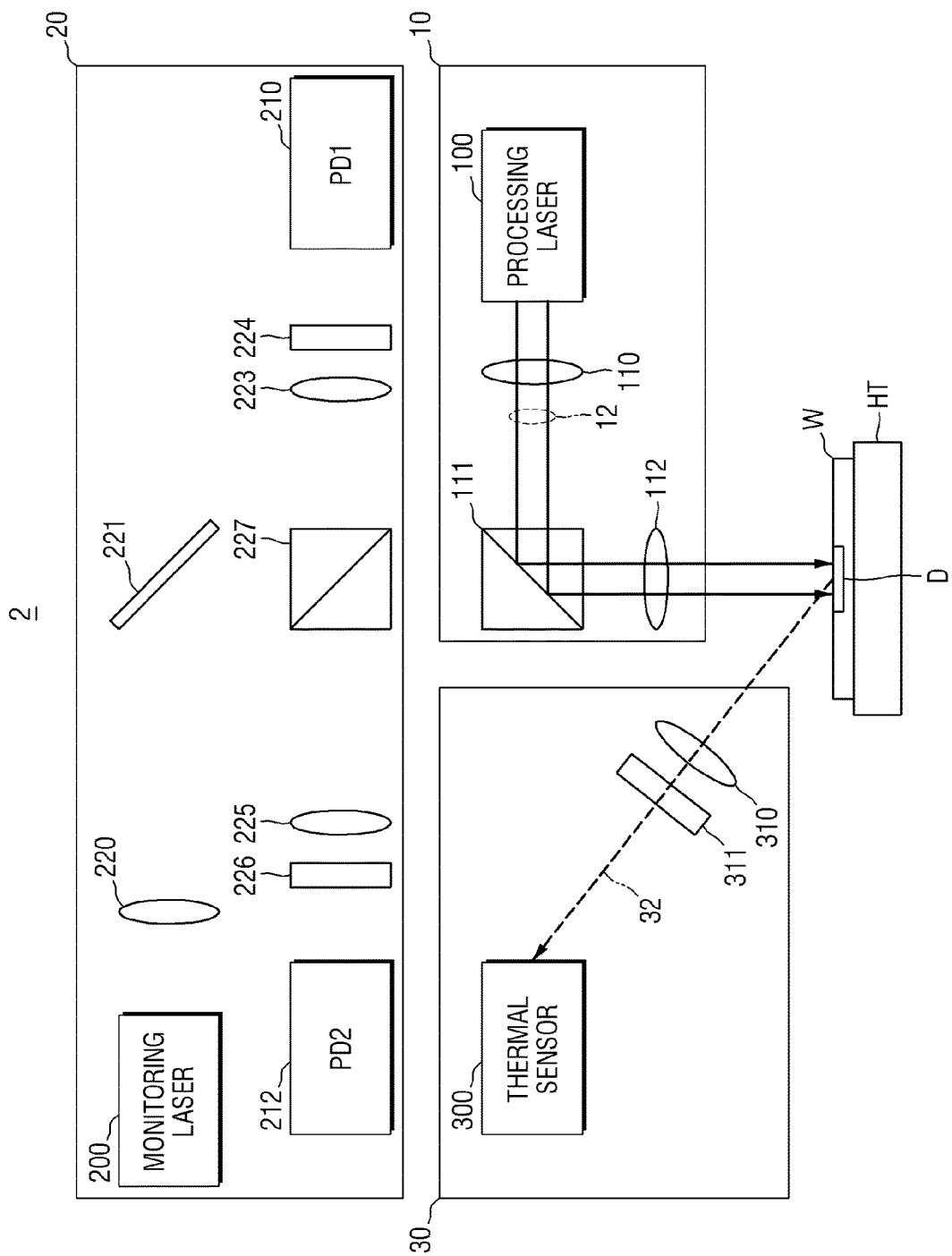
FIG. 13 is a diagram for explaining the operation of measuring the temperature of the surface of the wafer using the monitoring device of FIG. 2.

Accordingly, the data processing unit 44 of the control board 40 according to the embodiment may predict-'estimate the melting depth based on data about the reflectivity measured by the monitoring laser unit 20, FIG. 13 is a diagram for explaining the operation of measuring the temperature of the surface of the wafer W using the monitoring device 2 of FIG. 2.

Referring to FIG. 13, the thermal detecting unit 30 may include the thermal sensor 300, the lens 310, and the filter 311.

The thermal detecting unit 30 senses heat 32 emitted from the wafer W while the processing laser unit 10 performs a melting annealing process. The heat 32 is emitted from the wafer W and passes through the lens 310 and the filter 311 to reach the thermal sensor 300.

In an embodiment, the filter 311 may be a filter for passing a wavelength of, e.g., 1550 nm of the heat 32 emitted from the wafer W.

For example, when the processing laser unit 10 performs a melting annealing process on the wafer W on a die-by-die basis as described with respect to FIG. 3, the thermal detecting unit 30 may detect the first temperature of the surface of the first die D1 while the processing laser unit 10 performs the first melting annealing process on the first die D1 and then detect the second temperature of the surface of the second die D2 while the processing laser unit 10 performs the second melting annealing process on the second die D2.

The data processing unit 44 may then monitor the characteristics of the wafer W based on data about the first temperature and the second temperature measured by the thermal detecting unit 30.

Figure 14:
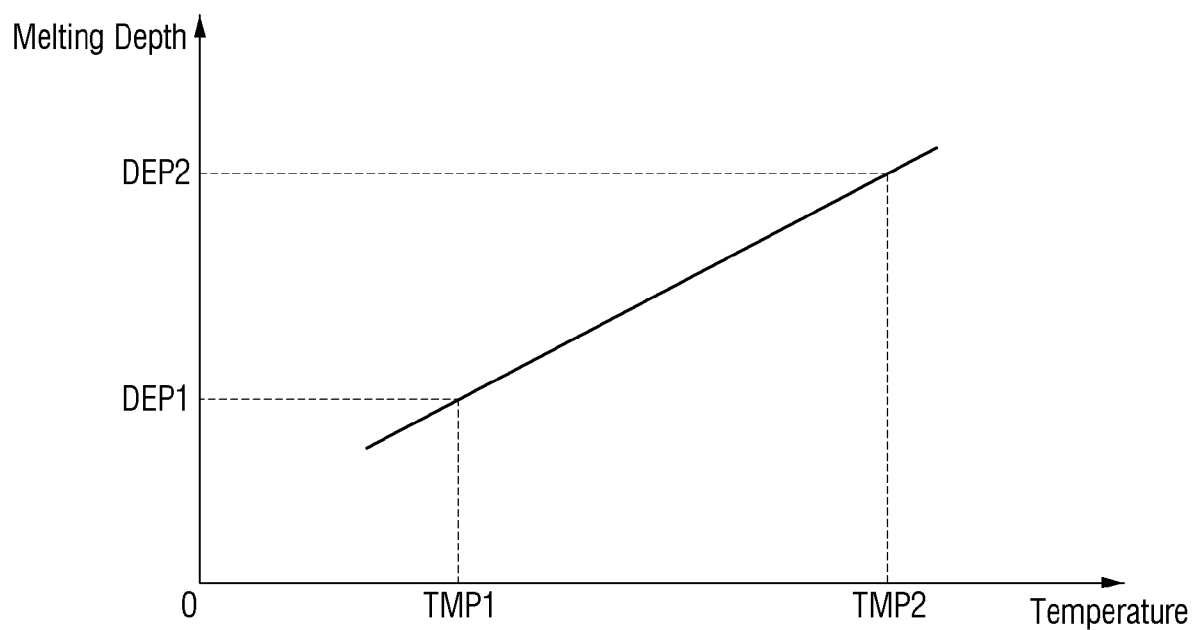
FIG. 14 is a graph illustrating the relationship between the temperature of the wafer surface and the melting depth.

FIG. 14 is a graph illustrating the relationship between the temperature of the wafer surface and the melting depth.

Referring to FIG. 14, the temperature of the surface of the wafer W measured by the thermal detecting unit 30 and the melting depth of the upper portion of the water W may have a substantially proportional relationship. Therefore, when the temperature TMP1 is relatively low as a result of analyzing the change in temperature, it may be predicted/estimated that the melting depth DEP1 of the upper portion of the wafer W is relatively shallow. Conversely, when the temperature TMP2 is relatively high, it may be predicted that the melting depth DEP2 of the upper portion of the wafer W is relatively deep.

Accordingly, the data processing unit 44 of the control board 40 according to the embodiment may predict/estimate the melting depth based on data about the temperature measured by the thermal detecting unit 30.

Figure 15:
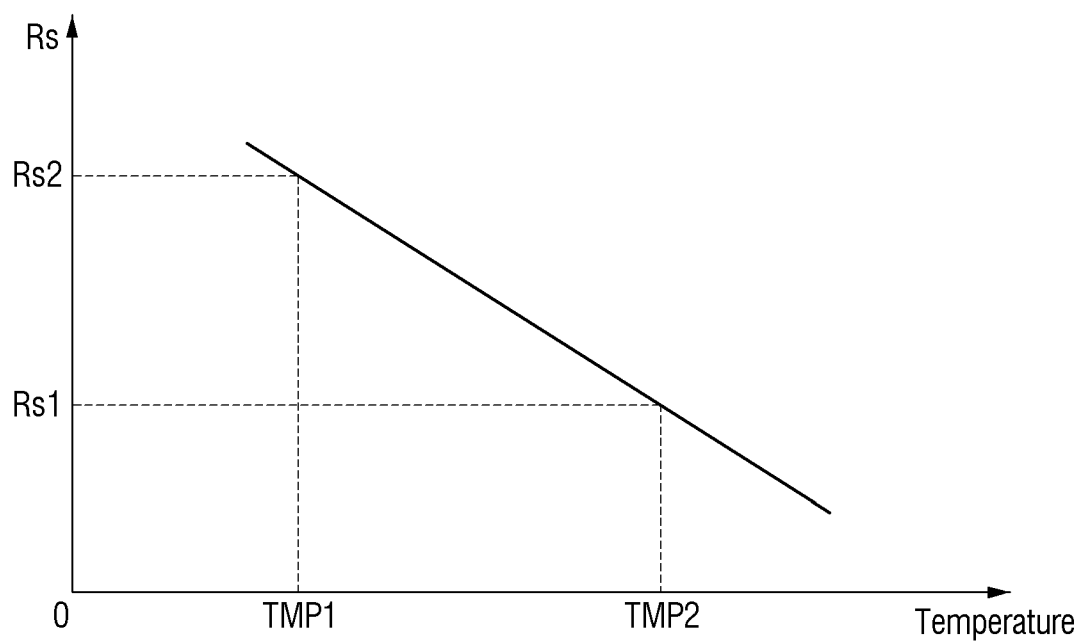
FIG. 15 is a graph illustrating the relationship between the temperature of the wafer surface and sheet resistance.

FIG. 15 is a graph illustrating the relationship between the temperature of the wafer surface and the sheet resistance.

Referring to FIG. 15, the temperature of the surface of the wafer W measured by the thermal detecting unit 30 and the sheet resistance of the wafer W may have a substantially inversely proportional relationship. Therefore, when the temperature TMP1 is relatively low as a result of analyzing the change in temperature, it may be predicted/estimated that the sheet resistance Rs2 of the wafer W is relatively high. Conversely, when the temperature TMP2 is relatively high, it may be predicted that the sheet resistance Rs1 of the wafer W is relatively low.

Accordingly, the data processing unit 44 of the control board 40 according to the embodiment may predict the sheet resistance based on data about the temperature measured by the thermal detecting unit 30. For example, with respect to an know material, e.g., amorphous silicon, polysilicon, crystalline silicon or another semiconductor material, the monitoring device 2 may be stored with data representing sheet resistances and corresponding surface temperature of the wafer W so that the data processing unit 44 may predict/determine the sheet resistance based on the temperature data.

Figure 16:
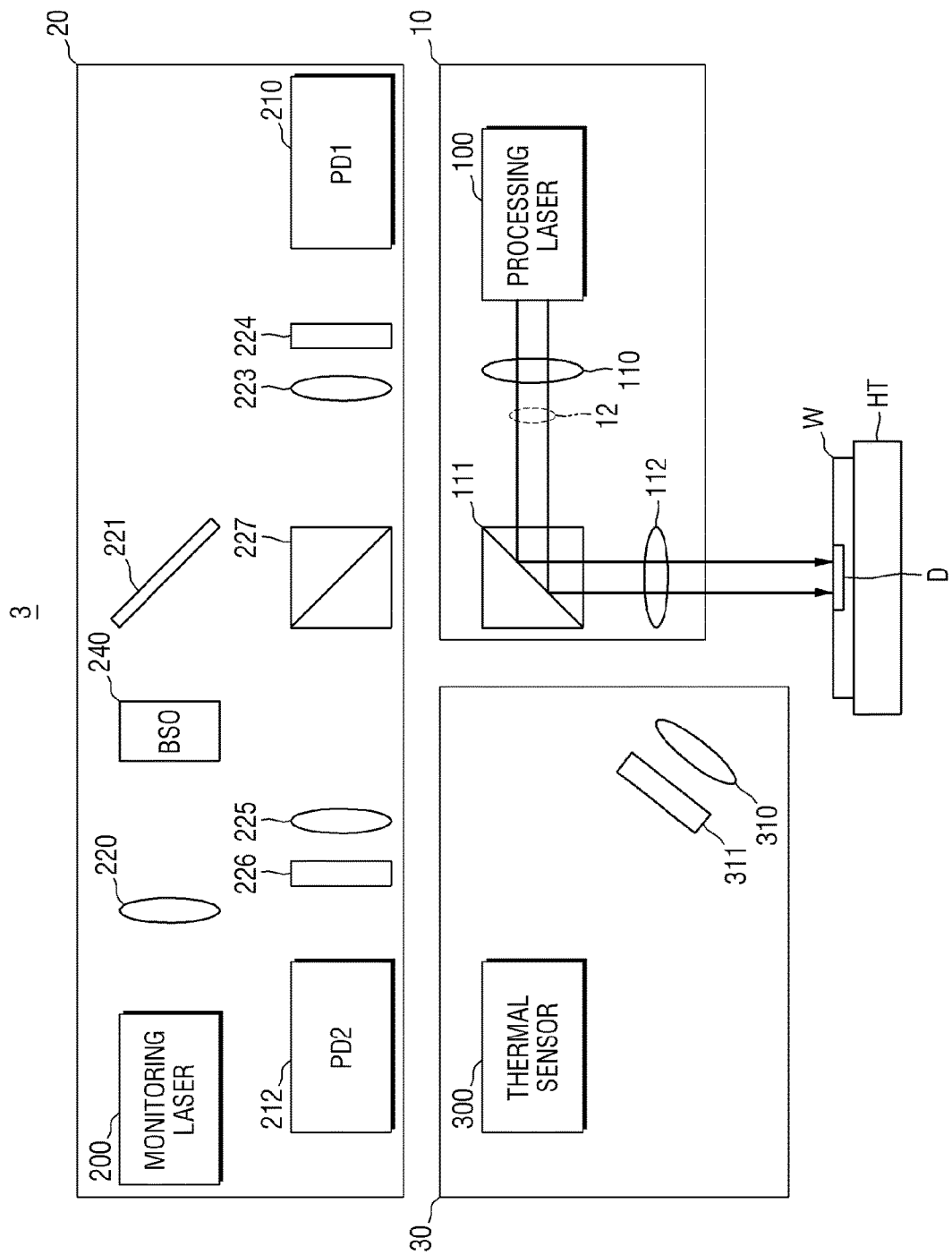
FIGS. 16 and 17 are diagrams for explaining a monitoring device according to an embodiment.
Figure 17:
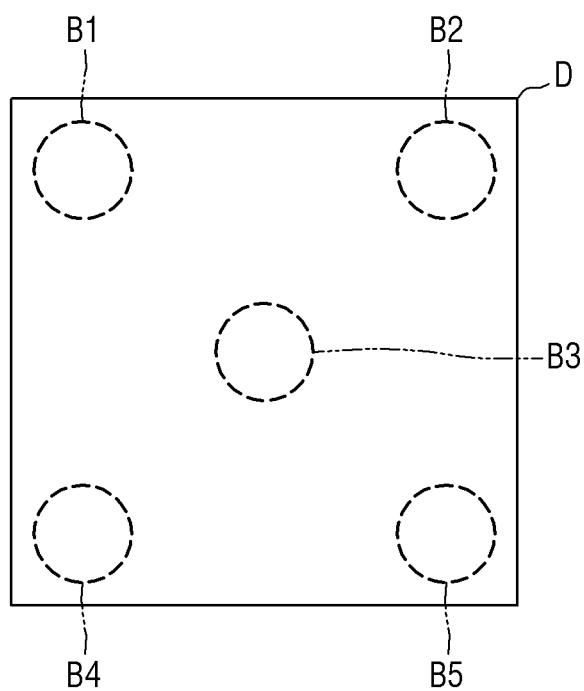

FIGS. 16 and 17 are diagrams for explaining a monitoring device 3 according to an embodiment.

Referring to FIG. 16, the monitoring device 3 according to the embodiment is different from the monitoring device 2 of FIG. 2 in that a monitoring laser unit 20 further includes a beam split optics unit 240.

The beam split optics unit 240 splits a monitoring laser beam 22c, which is to be incident on a die L) formed on a wafer W, into a plurality of beams. For example, the beam split optics unit 240 may split the monitoring laser beam 22c (shown in FIG. 18) into a plurality of beams so that the plurality of beams are incident on a die D of the wafer W. The beam split optics unit 240 may be a beam splitter.

Referring to FIG. 17, when the split monitoring laser beam 22d is incident on the die D, a cross section of the incident light 22e may be represented by a plurality of points/areas B1 through B5 on the die D, unlike in FIG. 5.

The monitoring laser unit 20 then measures the reflectivity of each of the points/areas B1 through B5 on the die D.

It should be noted that the configuration of the monitoring device 3 illustrated in FIG. 17 is merely an example embodiment, and the detailed configuration of a processing laser unit 10, the monitoring laser unit 20 and a thermal detecting unit 30 may be modified variously according to the purpose of implementation.

Figure 18:
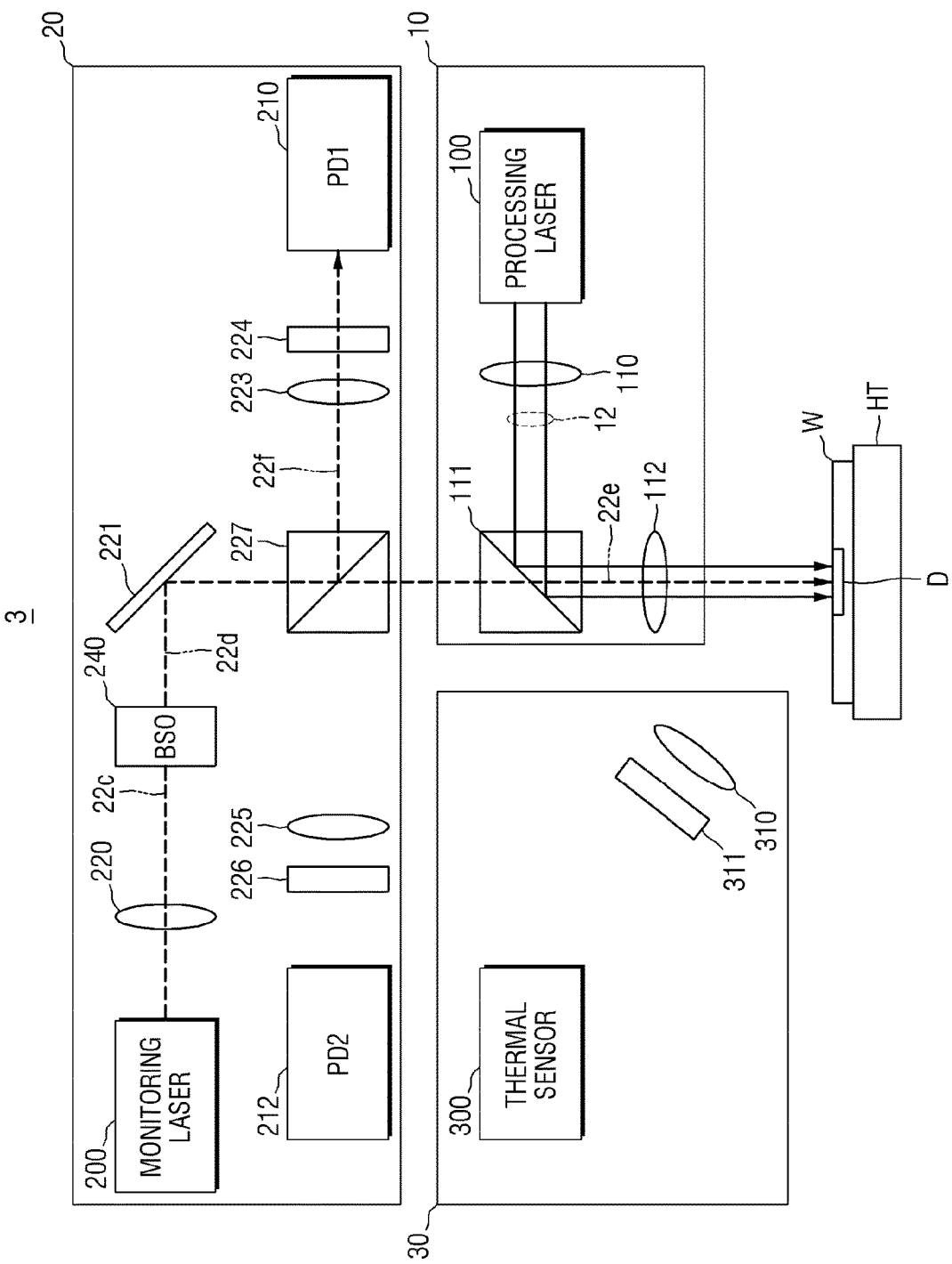
FIGS. 18 and 19 are diagrams for explaining the operation of measuring the reflectivity of a wafer using the monitoring device of FIG. 16.
Figure 19:
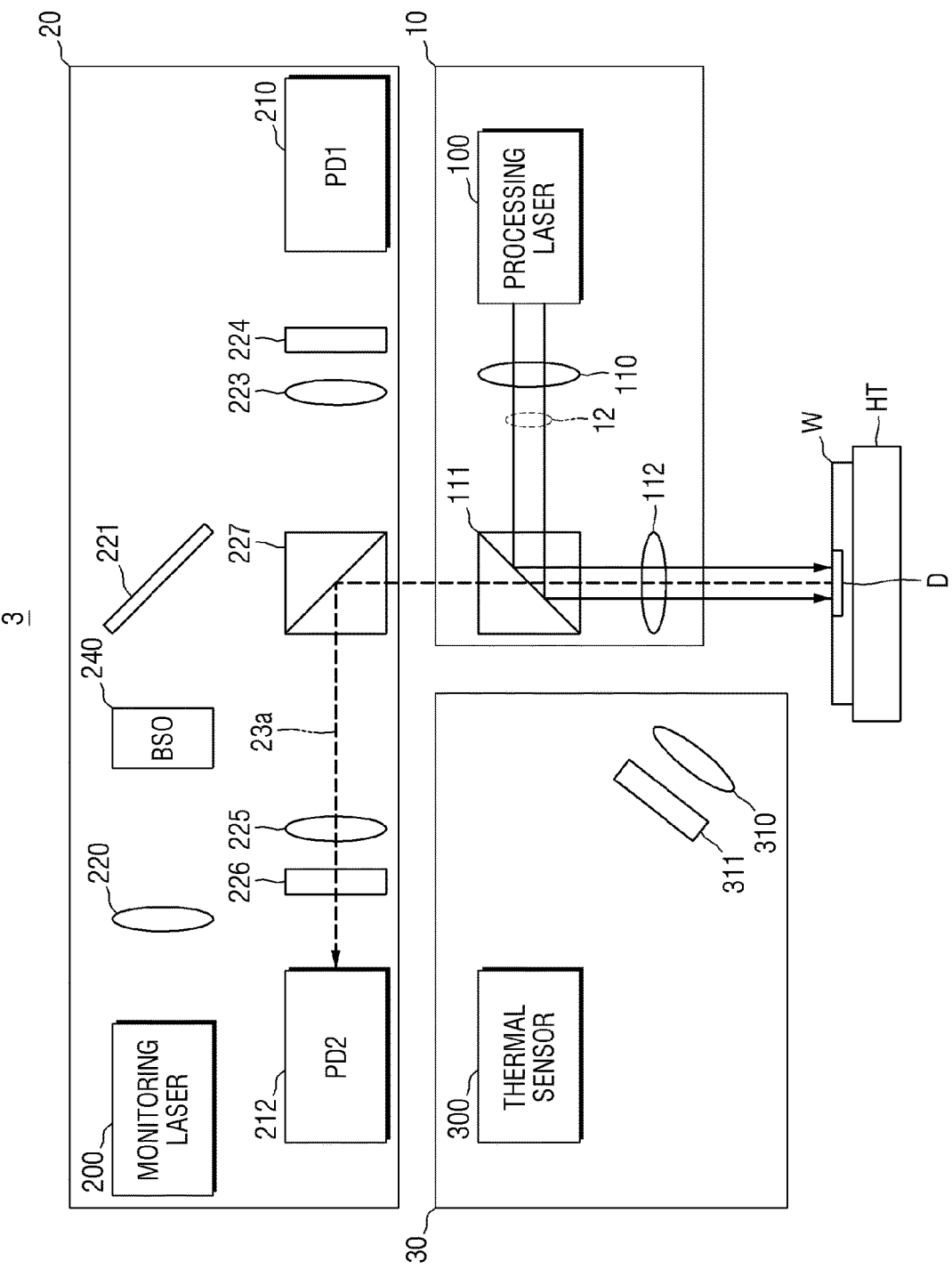

FIGS. 18 and 19 are diagrams for explaining the operation of measuring the reflectivity of a wafer W using the monitoring device 3 of FIG. 16.

Referring to FIG. 18, the monitoring laser unit 20 may include a monitoring laser emitter 200, a first light receiving unit 210, a second light receiving unit 212, lenses 220, 223 and 225, path changing optics 221 and 227, filters 224 and 226, and the beam split optics unit 240.

The monitoring laser emitter 200 of the monitoring laser unit 20 emits the monitoring laser beam 22c while the processing laser unit 10 performs a melting annealing process using a processing laser beam 12. The monitoring laser beam 22c passes through the lens 220 and is converted into the split monitoring laser beam 22d by the beam split optics unit 240. For example, the split monitoring laser beam 22d may be formed of a plurality of separated laser beams as shown in FIG. 17. For example, the cross-sectional area connecting the outer most parts of the laser beams of the plurality of laser beams of the split monitoring laser beam 22d may be greater than the cross-sectional area of the monitoring laser beam 22c emitted from the monitoring laser emitter 200. For example, the plurality of laser beams of the split monitoring laser beam 22d may travel parallel to one another. The split monitoring laser beam 22d changes its traveling direction to the wafer W according to the path changing optics 221. The split monitoring laser beam 22d that has changed its traveling direction travels to the first light receiving unit 210 and a path changing optics 111 according to the path changing optics 227. For example, the path changing optics 227 may control the path of the split monitoring laser beam 22d so that the split monitoring laser beam 22d may transmit (e.g., by reflection and/or refraction) to the first light receiving unit 210 in a first period of time and to the path changing optics 111 and/or to the dies in a second period of time. In certain embodiments, a part of the split monitoring laser beam 22d is incident to the first light receiving unit 210, and another part of the split monitoring laser beam 22d is incident to the path changing optics 111 and/or to the dies D by the path changing optics 227.

The first light receiving unit 210 receives reference light 22f travelling along a path branched by the path changing optics 227. For example, the reference light 22f travelling along the path branched from the split monitoring laser beam 22d by the path changing optics 227 passes through the lens 223 and the filter 224 and enters the first light receiving unit 210. In an embodiment, the filter 224 may be a filter for passing light having a wavelength of, e.g., 658 nm.

The split monitoring laser beam 22d travelling to the path changing optics 111 may pass through a lens 112 and enter the wafer W. Here, referring again to FIG. 17, when the split monitoring laser beam 22d is incident on a die D, the cross section of the incident light 22e may be represented by the points/areas B1 through B5 as illustrated in FIG. 17.

Next, referring to FIG. 19, the second light receiving unit 212 receives split reflected light 23a reflected from the wafer W. The split reflected light 23a passes through the lens 112 and the path changing optics 111 and then changes its travelling direction to the second light receiving unit 212 according to the path changing optics 227. The split reflected light 23a that has changed its traveling direction passes through the lens 225 and the filter 226 and enters the second light receiving unit 212 as shown in FIG. 19. In an embodiment, the filter 226 may be a filter for passing light having a wavelength of, e.g., 658 nm.

The monitoring laser unit 20 may measure reflectivity using the first light receiving unit 210 and the second light receiving unit 212. For example, the monitoring laser unit 20 may measure reflectivity by comparing the intensity of the reference light 22f received through the first light receiving unit 210 with the intensity of the split reflected light 23a received through the second light receiving unit 212 for each of the points/areas B1 through B5.

For example, when the processing laser unit 10 performs a melting annealing process on the wafer W on a die-by-die basis as described with respect to FIG. 3, the monitoring laser unit 20 may measure first reflectivity of a first die D1 and second reflectivity of a second die D2 by comparing the intensities of the split monitoring laser beam 22d incident on the first die D1 and the second die D2 with the intensities of the split reflected light 23a reflected from the first die D1 and the second die D2, respectively.

Here, the first light receiving unit 210 may receive the split monitoring laser beam 22d incident on the first die D1 and the second die D2, the second light receiving unit 212 may receive the split reflected light 23a reflected from the first die D1 and the second die D2, and the monitoring laser unit 20 may measure reflectivity by using the first light receiving unit 210 and the second light receiving unit 212. For example, the first light receiving unit 210 may examine the intensity of the split monitoring laser beam 22d by receiving the whole beam or a partial beam of the split monitoring laser beam 22d. In the embodiment that the first light receiving unit 210 receives a partial beam of the split monitoring laser beam 22d, the data processing unit 44 may calculate the intensity of the split monitoring laser beam 22d to be proportional to the intensity of the partial beam by using a predetermined parameter.

Figure 20:
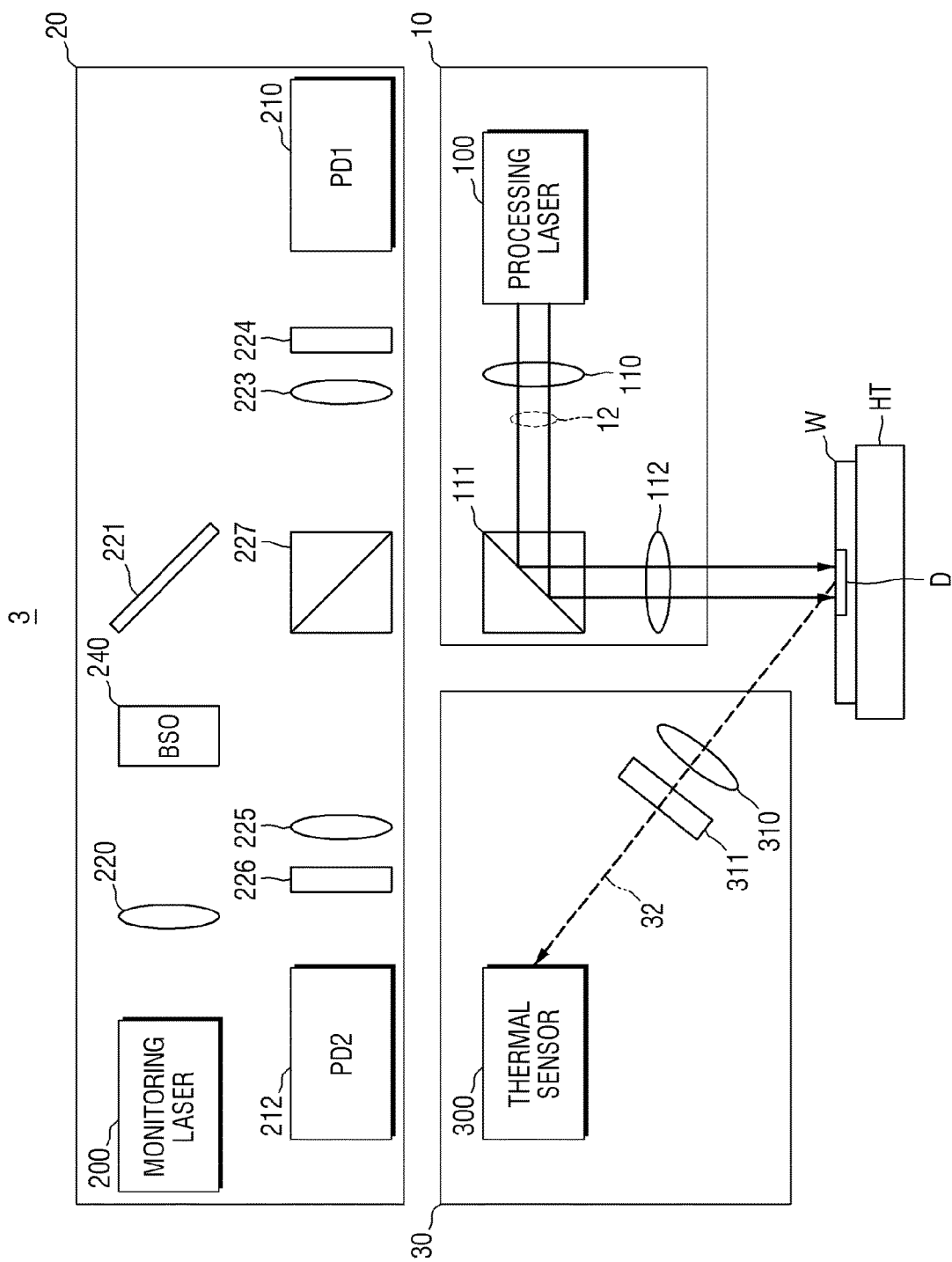
FIG. 20 is a diagram for explaining the operation of measuring the temperature of the surface of the wafer using the monitoring device of FIG. 16.

FIG. 20 is a diagram for explaining the operation of measuring the temperature of the surface of the wafer W using the monitoring device 3 of FIG. 16.

Referring to FIG. 20, the thermal detecting unit 30 may sense heat 32 emitted from the wafer W as described with respect to FIG. 13, in connection with the monitoring laser unit 20 of FIGS. 18 and 19 using the beam split optics unit 240.

Figure 21:
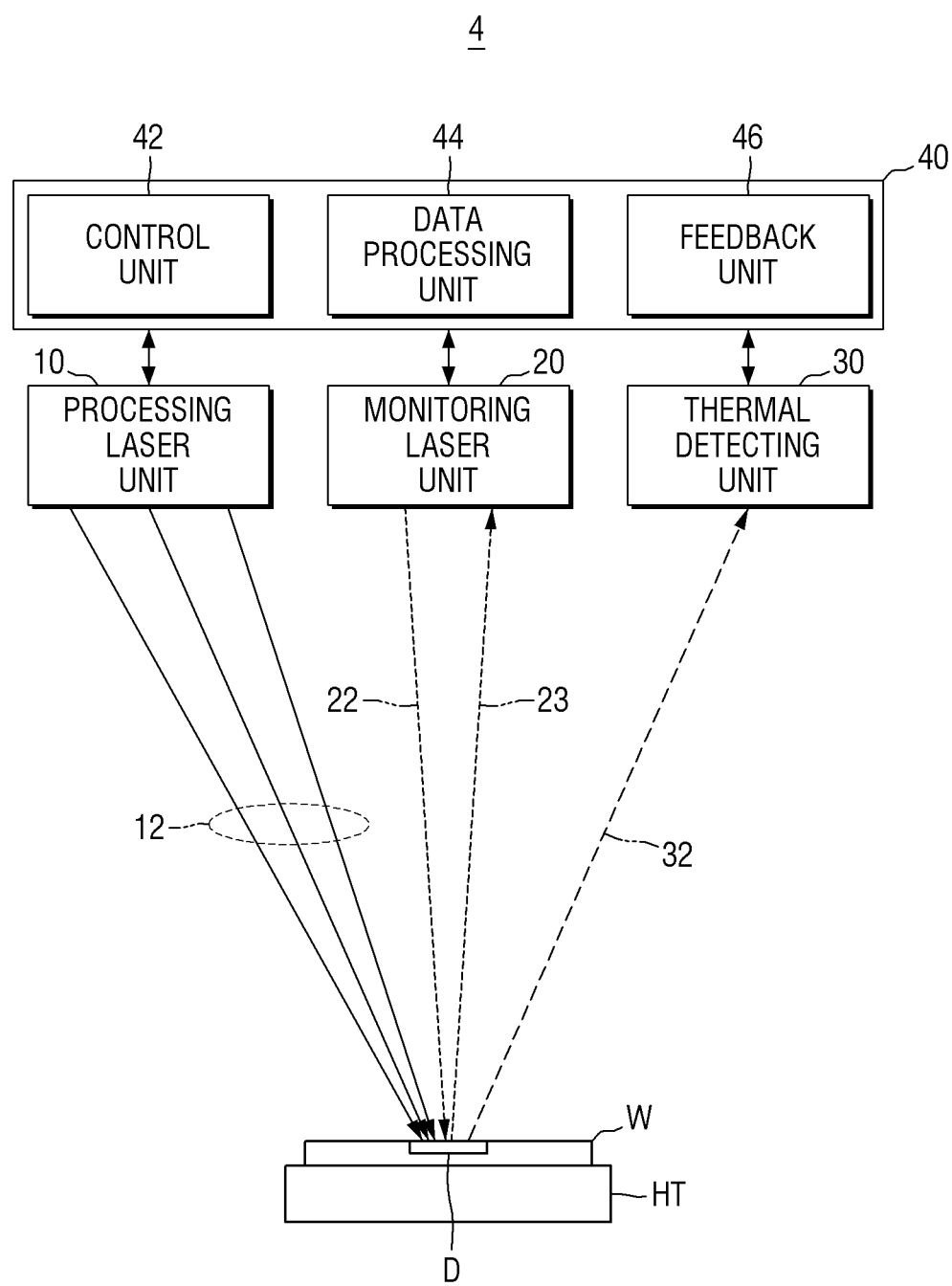
FIG. 21 is a schematic diagram of a monitoring system according to an embodiment.

FIG. 21 is a schematic diagram of a monitoring system 4 according to an embodiment.

Referring to FIG. 21, the monitoring system 4 according to the embodiment may include a processing laser unit 10, a monitoring laser unit 20, a thermal detecting unit 30 and a control board 40, and the control board 40 may include a control unit 42, a data processing unit 44 and a feedback unit 46.

The feedback unit 46 provides the control unit 42 with feedback data on the characteristics of a wafer W monitored by the monitoring laser unit 20 and the thermal detecting unit 30. The control unit 42 receiving the feedback data may control the setting of at least one of the processing laser unit 10, the monitoring laser unit 20, and the thermal detecting unit 30 based on the feedback data. For example, the control unit 42 may perform control such as changing the wavelength of a processing laser beam 12 emitted from the processing laser unit 10, adjusting the power, or adjusting the emission time. For another example, the control unit 42 may perform control such as changing the wavelength of a monitoring laser beam 22 emitted from the monitoring laser unit 20 or adjusting the emission time. The feedback unit 46 may be a feedback circuit, and may be formed as an integrated circuit in a semiconductor chip and/or may be formed in a semiconductor device package.

Here, the feedback data refers to data for making an adjustment request to the control unit 42 when a characteristic of the wafer W monitored in a previous operation needs to be adjusted. For example, when the melting depth is excessively deep, the feedback unit 46 may send to the control unit 42 a request to lower the power of the processing laser beam 12 as the feedback data. Conversely, when the melting depth is too shallow, the feedback unit 46 may send to the control unit 42 a request to increase the power of the processing laser beam 12 as the feedback data.

Figure 22:
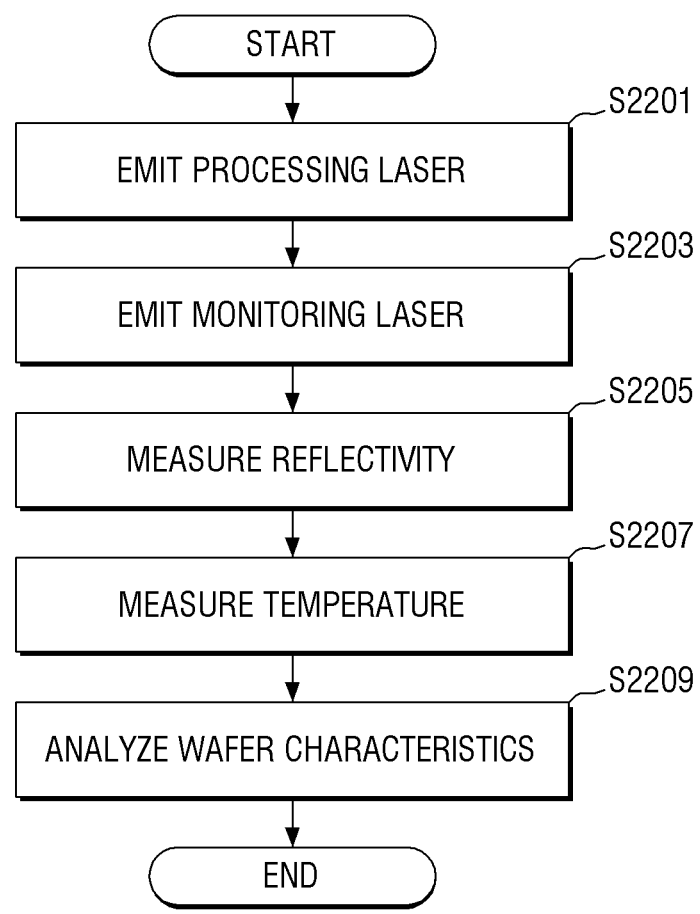
FIG. 22 is a flowchart illustrating a monitoring method according to an embodiment.

FIG. 22 is a flowchart illustrating a monitoring method according to an embodiment.

Referring to FIG. 22, the monitoring method according to the embodiment includes performing a melting annealing process on a wafer W by emitting a processing laser beam 12 to the wafer W (operation S2201).

The method also includes emitting a monitoring laser beam 22 to the wafer W (operation S2203) while the melting annealing process is being performed and measuring the reflectivity of the water W by comparing the intensity of the monitoring laser beam 22 with the intensity of reflected light 23 (operation S2205). For example the intensity of the monitoring laser beam 22 may be an intensity of light of the monitoring laser beam 22, and the intensity of reflected light 23 may be an intensity of light that the monitoring laser beam 22 is reflected from a surface of the wafer W.

The method also includes measuring the temperature of the surface of the wafer W (S2207) while the melting annealing process is performed.

The method also includes analyzing the characteristics of the wafer W based on data about the measured reflectivity and/or temperature (operation S2209).

Figure 23:
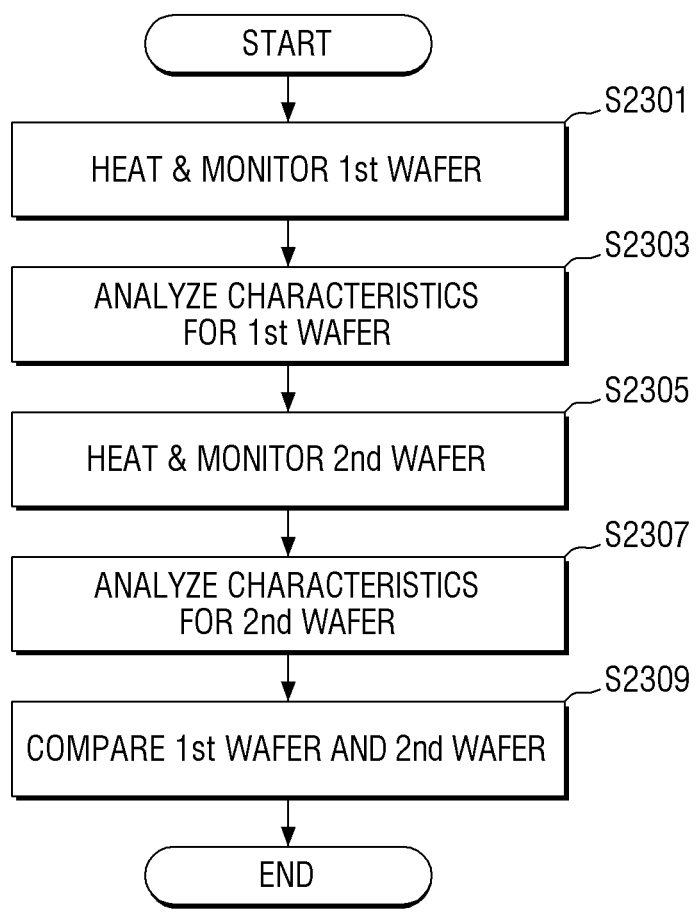
FIG. 23 is a flowchart illustrating a monitoring method according to an embodiment.

FIG. 23 is a flowchart illustrating a monitoring method according to an embodiment.

Referring to FIG. 23, the monitoring method according to the embodiment includes heating and monitoring a first wafer (operation S2301) and analyzing first characteristics of the first wafer (operation S2303).

The method also includes heating and monitoring a second wafer (operation S2305) and analyzing second characteristics of the second wafer (operation S2307).

The method also includes comparing the first characteristics of the first wafer with the second characteristics of the second wafer operation S2309).

Figure 24:
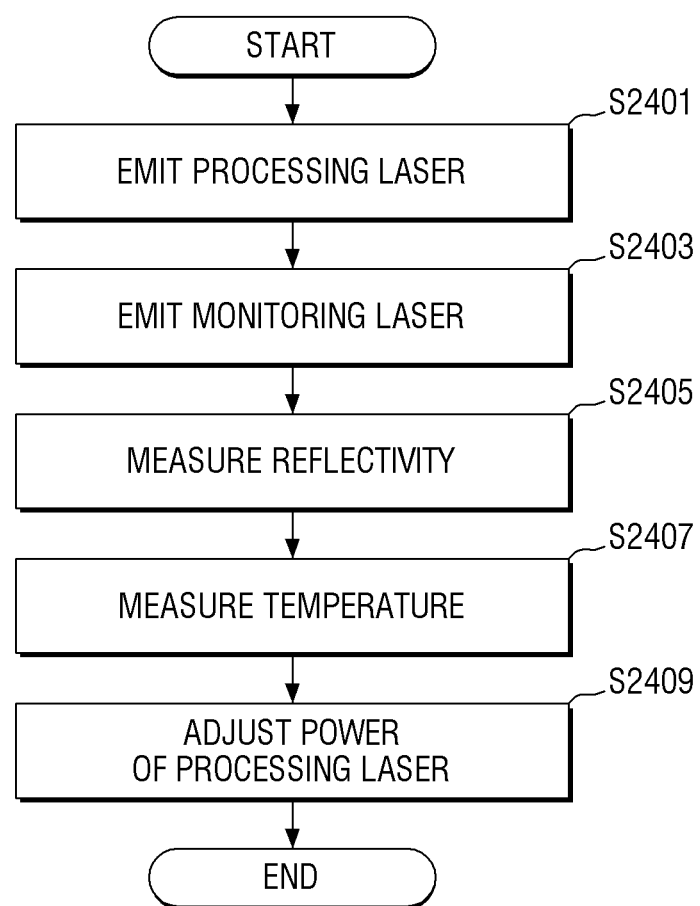
FIG. 24 is a flowchart illustrating a monitoring method according to an embodiment.

According to the present method, the uniformity of melting depth between wafers may be compared and in-situ monitoring may be performed so as to compare changes in grain size between wafers, FIG. 24 is a flowchart illustrating a monitoring method according to an embodiment.

Referring to FIG. 24, the monitoring method according to the embodiment includes performing a melting annealing process on a wafer W by emitting a processing laser beam 12 to the wafer W (operation S2401).

The method also includes emitting a monitoring laser beam 22 to the wafer W (operation S2403) while the melting annealing process is performed and measuring the reflectivity of the wafer W by comparing the intensity of the monitoring laser beam 22 with the intensity of reflected light 23 (operation S2405).

The method also includes measuring the temperature of the surface of the water W (operation S2407) while the melting annealing process is performed.

The method also includes adjusting the power of the processing laser beam 12 based on data about the measured reflectivity and/or temperature (operation S2409).

According to the monitoring devices and the monitoring methods of the various embodiments described so far, even if a melting process is performed for a very; short time of several nanoseconds to several tens of nanoseconds, in-situ monitoring of the melting process may be accurately performed during that time, and in-situ identification of the characteristics of a wafer may be performed while the melting annealing process is performed.

For example, while the melting annealing process is performed, a monitoring laser is emitted to the wafer, and reflected light is received. Then, a change in the reflectivity of the wafer is defined as a kind of reference pattern, and a change in reflectivity in a subsequent process is compared with the reference pattern. In this way, in-situ monitoring may be performed, and the characteristics of the wafer may be predicted. While the melting annealing process is performed, in-situ monitoring may be also performed and the characteristics of the wafer may be predicted by sensing heat emitted from the wafer.

Furthermore, the power of a processing laser may be controlled by using the result of analyzing the wafer characteristics or the process dispersion may be controlled through comparison between wafers.

A method of manufacturing a semiconductor device according to an embodiment of the present disclosure will be described below.

According to the method of manufacturing a semiconductor device, a substrate may be provided. The substrate may be a semiconductor substrate, for example, a silicon substrate, a germanium substrate or a silicon-germanium substrate. Various semiconductor patterns and various conductor patterns may be formed on the substrate to form circuits including transistors, capacitors and/or switches via a plurality of manufacturing processes including multiple steps of photolithography processes. One or more melting annealing processes may be applied before, between and/or after performing the plurality of manufacturing processes. During the melting annealing processes, a monitoring method described in various embodiments of the present disclosure may be applied to the substrate. In certain embodiments, the melting annealing processes may adjust the process conditions using a result of the monitoring obtained by a monitoring method described in the present disclosure. After forming various circuits on the substrate, the substrate may be diced and packaged.

In concluding the detailed description, those skilled in the art will appreciate that many variations and modifications may be made to the preferred embodiments described above without substantially departing from the principles of the present disclosure. Therefore, the disclosed preferred embodiments of the disclosure are used in a generic and descriptive sense only and not for purposes of limitation.

What is claimed is:

1. A monitoring method comprising:
    performing a melting annealing process on a wafer by emitting a processing laser beam to the wafer;
    measuring reflectivity of the wafer by emitting a monitoring laser beam to the wafer while the melting annealing process is performed; and
    monitoring characteristics of the wafer based on the measured reflectivity,
    wherein the processing laser beam is provided by a laser processor and the monitoring laser beam is provided by a laser monitor, and the laser processor and the laser monitor are different units from each other,
    wherein the laser monitor comprises:
        a path changing optics branching the monitoring laser beam such that a first part of the monitoring laser beam branched by the path changing optics is incident on the wafer;
        a first light receiver receiving a second part of the monitoring laser beam branched by the path changing optics; and
        a second light receiver receiving a reflected light of the first part of the monitoring laser beam reflected by the wafer,
    wherein the first light receiver and the second light receiver are different light receivers from each other,
    wherein the reflected light of the first part of the monitoring laser beam passes through the path changing optics that branches the monitoring laser beam, and
    wherein a laser monitor measures the reflectivity by comparing intensity of the second part of the monitoring laser beam received by the first light receiver with intensity of the reflected light received by the second light receiver.

2. The monitoring method of claim 1, wherein the measuring of the reflectivity of the wafer comprises measuring the reflectivity of the wafer for each die formed on the wafer.

3. The monitoring method of claim 1, wherein the measuring of the reflectivity of the wafer comprises splitting the monitoring laser beam, which is to be incident on a die formed on the wafer, into a plurality of beams and measuring the reflectivity at a plurality of points in the die on which the plurality of beams is incident.

4. The monitoring method of claim 1, further comprising:
    detecting temperature of a surface of the wafer while the melting annealing process is performed; and
    monitoring the characteristics of the wafer based on the detected temperature.

5. The monitoring method of claim 4, wherein the detecting of the temperature of the surface of the wafer comprises detecting the temperature of the surface of the wafer for each die formed on the wafer.

6. The monitoring method of claim 1, wherein the characteristics of the wafer comprise at least one of a melting depth of the wafer, a uniformity of the melting depth, a size of grains, a doping concentration of a film, a type of the film, and a sheet resistance of the film.

7. The monitoring method of claim 1, further comprising adjusting power of the processing laser beam according to the monitored characteristics of the wafer.

8. The monitoring method of claim 1, wherein the characteristics of the wafer comprise first characteristics of a first wafer and second characteristics of a second wafer, and the monitoring of the characteristics of the wafer comprises monitoring the first characteristics and the second characteristics and comparing the first characteristics and the second characteristics.

\* \* \* \* \*